(12) United States Patent
Lim et al.

(10) Patent No.: US 10,529,594 B2
(45) Date of Patent: Jan. 7, 2020

(54) APPARATUS AND METHOD FOR TREATING SUBSTRATE

(71) Applicant: SEMES CO., LTD., Chungcheongnam-do (KR)

(72) Inventors: Do-Youn Lim, Chungcheongnam-do (KR); Joonho Won, Chungcheongnam-do (KR); Kisang Eum, Chungcheongnam-do (KR); Boong Kim, Cheonan-si (KR); Joo Jib Park, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 149 days.

(21) Appl. No.: 15/793,263

(22) Filed: Oct. 25, 2017

(65) Prior Publication Data

US 2018/0114707 A1    Apr. 26, 2018

(30) Foreign Application Priority Data

Oct. 26, 2016 (KR) .................. 10-2016-0140193

(51) Int. Cl.
*F27B 17/00* (2006.01)
*H01L 21/67* (2006.01)
(Continued)

(52) U.S. Cl.
CPC .......... *H01L 21/67034* (2013.01); *F26B 5/04* (2013.01); *H01L 21/02052* (2013.01);
(Continued)

(58) Field of Classification Search
CPC .............. F27B 17/0016; F27B 17/0025; F27D 2001/0059; F27D 5/0006
See application file for complete search history.

(56) References Cited

U.S. PATENT DOCUMENTS 5,739,050 A * 4/1998 Farnworth ........ H01L 21/67121
438/14
6,067,728 A * 5/2000 Farmer ............. H01L 21/67028
134/902
(Continued)

FOREIGN PATENT DOCUMENTS

JP      2011097101 A    5/2011
KR    20010050280 A    6/2001
(Continued)

*Primary Examiner* — Gregory A Wilson
(74) *Attorney, Agent, or Firm* — Carter, Deluca & Farrell LLP

(57) ABSTRACT

Embodiments of the inventive concept relate to an apparatus for treating a substrate in a high-pressure atmosphere. The apparatus includes a process chamber having an upper body and a lower body that are combined with each other to provide a treatment space therein, an elevation member configured to elevate any one of the upper body and the lower body to an opening location at which the upper body and the lower body is spaced apart or a closing location at which the upper body and the lower body is attached, a clamping member configured to clamp the upper body and the lower body located at the closing location, and a movable member configured to move the clamping member to a locking location at which the clamping member clamps the process chamber or to the release location at which the clamping member is spaced apart from the process chamber.

23 Claims, 23 Drawing Sheets

(51) Int. Cl.
*F26B 5/04* (2006.01)
*H01L 21/02* (2006.01)
(52) U.S. Cl.
CPC ...... *H01L 21/6704* (2013.01); *H01L 21/6708* (2013.01); *H01L 21/6715* (2013.01); *H01L 21/67051* (2013.01); *H01L 21/02101* (2013.01)

(56) References Cited

U.S. PATENT DOCUMENTS

| | | | | |
|---|---|---|---|---|
| 6,455,397 | B1* | 9/2002 | Belford | H01L 21/76251 257/E21.567 |
| 6,787,382 | B1* | 9/2004 | Wing | B28D 5/0094 269/292 |
| 8,043,431 | B2* | 10/2011 | Ozaki | C23C 16/4401 118/715 |
| 8,092,606 | B2* | 1/2012 | Park | C23C 16/45519 118/715 |
| 2002/0086260 | A1* | 7/2002 | Shang | H01L 21/67109 432/247 |

FOREIGN PATENT DOCUMENTS

| | | |
|---|---|---|
| KR | 10-2007-050792 A | 5/2007 |
| KR | 10-1180842 B1 | 9/2012 |
| KR | 10-1220697 B1 | 1/2013 |
| KR | 10-2013-0053108 A | 5/2013 |
| KR | 10-1329304 B1 | 11/2013 |
| KR | 10-1344925 B1 | 12/2013 |
| KR | 20150078606 A | 7/2015 |

* cited by examiner

PRIOR ART

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2016-0140193 filed on Oct. 26, 2016, in the Korean Intellectual Property Office, the entire contents of which are hereby incorporated by reference.

BACKGROUND

Embodiments of the inventive concept relate to an apparatus and a method for treating a substrate, and more particularly, to an apparatus and a method for treating a substrate in a high-pressure atmosphere.

In order to manufacture a semiconductor device, a desired pattern is formed on a substrate through various processes such as, photographing, etching, ashing, ion injection, and deposition of thin films. Various treatment liquids are used in the processes, and contaminants and particles are generated during the process. In order to solve this, a cleaning process for cleaning contaminants and particles is essentially performed before and after the process.

In general, in the cleaning process, a substrate is dried after being treated with a chemical and a rinsing liquid. The drying operation is a process of drying a rinsing liquid residing on a substrate, and the rinsing liquid on the substrate is substituted by an organic solvent, such as isopropyl alcohol, a surface tension of which is lower than that of the rinsing liquid, and then the organic solvent is removed. However, a critical dimension (CD) between the patterns formed in the substrate becomes smaller, the organic solvent residing in spaces between the patterns cannot be easily removed.

In recent years, a process of removing an organic solvent residing on a substrate by using a supercritical fluid has been performed. The supercritical treatment process is performed in a high-pressure space closed from the outside to satisfy a specific condition of a supercritical fluid.

FIG. 1 is a sectional view illustrating a general supercritical treatment apparatus. Referring to FIG. 1, a process chamber for performing a supercritical treatment process has an upper body 2 and a lower body 4. The lower body 4 has an open-topped cup shape, and the upper body 2 has a plate shape. The upper body 2 and the lower body 4 are combined with each other to form a treatment space therebetween. In order to close the treatment space even in a high-pressure condition, a cylinder continuously provides a strong force in a direction in which the upper body 2 and the lower body 4 become closer to each other.

However, as the cylinder 6 continuously provides a strong force during a process, stresses are applied to the cylinder 6. Accordingly, the cylinder 6 may be damaged, and the atmosphere in the treatment space is leaked to the outside due to the high pressure of the treatment space.

PRIOR TECHNICAL DOCUMENTS

Patent Documents

Korean Patent Application Publication No. 10-2011-0117699

SUMMARY

Embodiments of the inventive concept provide an apparatus and a method for stably closing an atmosphere in a treatment space from the outside during a process.

Embodiments of the inventive concept also provide an apparatus and a method for applying a force for attaching a plurality of bodies.

Embodiments of the inventive concept also provide an apparatus and a method for preventing some devices from being damaged in a process of attaching a plurality of bodies.

The objects of the inventive concept are not limited to the above-described ones. Other technical objects that are not mentioned will be clearly understood from the following description by those skilled in the art to which the inventive concept pertains.

The inventive concept relates to an apparatus and a method for treating a substrate, and more particularly, to an apparatus and a method for treating a substrate in a high-pressure atmosphere. In accordance with an aspect of the inventive concept, there is provided a substrate treating apparatus including a process chamber having an upper body and a lower body that are combined with each other to provide a treatment space therein, an elevation member configured to elevate any one of the upper body and the lower body to an opening location at which the one of the upper body and the lower body is spaced apart from the other of the upper body and the lower body or a closing location at which the one of the upper body and the lower body is attached to the other of the upper body and the lower body, a clamping member configured to clamp the upper body and the lower body located at the closing location, and a movable member configured to move the clamping member to a locking location at which the clamping member clamps the upper body and the lower body or to the release location at which the clamping member is spaced apart from the upper body and the lower body.

The substrate treating apparatus may further include a substrate support unit configured to support the substrate in the treatment space, and a fluid supply unit configured to support a treatment fluid to the treatment space. The clamping member may include a first clamp located on one side of the process chamber, and a second clamp located to face the first clamp while the process chamber being interposed between the first clamp and the second clamp. The upper body may be shaped such that a central portion of an upper surface thereof is higher than an peripheral portion of the upper surface thereof, the lower body may be shaped such that a central portion of a bottom surface thereof is lower than a peripheral portion of the bottom surface thereof, and each of the first clamp and the second clamp may have a clamp groove, into which the peripheral portion of the upper surface of the upper body and the peripheral portion of the bottom surface of the lower body are inserted, on an inner surface thereof. Each of the first clamp and the second clamp may include an upper surface that is inclined downwards as it goes toward the upper body, a lower surface that is inclined upwards as it goes towards the lower body, and a side surface connecting the upper surface and the lower surface, the clamp groove may be formed through combination of the upper surface, the lower surface, and the side surface, the peripheral portion of the upper surface of the upper body may have a shape corresponding to the upper surfaces of the first clamp and the second clamp, and the peripheral portion of the bottom surface of the lower body may have a shape corresponding to the lower surfaces of the first clamp and the second clamp.

The substrate treating apparatus may further include a housing surrounding the process chamber, the clamping member, and the elevation member, the housing may include a tub-shaped body, and an intermediate plate partitioning an interior of the body into an upper space and a lower space and having a hollow, and the process chamber and the clamping member may be located in any one of the upper space and the lower space, and the elevation member is located in the other of the upper space and the lower space. The elevation member may include a support plate configured to support one of the upper body and the lower body, the support plate being able to elevate, and the support plate may have a diameter that is larger than a diameter of the hollow. The movable member may include a guide rail having a lengthwise direction that is perpendicular to the elevation direction, a bracket coupling the guide rail and the clamping member, and a driving member configured to drive the guide rail such that the clamping member is moved to the locking location or the release location along the lengthwise direction of the guide rail. The guide rail may be installed on an upper surface or a bottom surface of the housing outside the housing.

The movable member may include a driving shaft, a lengthwise direction of which is parallel to the elevation direction and to which the first clamp and the second clamp are hinge-coupled, and a driving member configured to drive the driving shaft such that the clamping member is moved to the locking location or the release location along the lengthwise direction of the driving shaft.

Any one of the upper body and the lower body may be moved by the elevation member, and the other of the upper body and the lower body is fixed to the housing, the housing may include an impact absorbing member configured to support one of the upper body and the lower body, which is fixed to the housing, and the impact absorbing member may be formed of an elastic material.

A first hole of a slit shape that passes through an inner surface and an outer surface of the first clamp may be formed at one end of the first clamp, a second hole of a slit shape that passes through an inner surface and an outer surface of the second clamp may be formed at one end of the second clamp, the first hole and the second hole of the clamping member may be communicated with each other at the locking location, and the first hole and the second hole may function as passages, through which the substrate is carried in and out.

The substrate treating apparatus may further include a controller configured to control the elevation member and the movable member, the elevation member may further include a driver configured to elevate the upper body or the lower body, the controller may control the driver and the movable member to perform an attachment operation of providing a driving force to the driver such that the lower body and the upper body are attached to each other if the substrate is introduced into the treatment space, a clamping operation of, after the attachment operation, clamping the upper body and the lower body attached to each other by the driving force with the clamping member, and a release operation of, after the clamping operation, releasing the driving force of the driver while the clamping operation has been performed, and a process for the substrate may be performed after the driving force is released.

The process chamber may further include a sealing member located between the upper body and the lower body to seal a space between the upper body and the lower body, the sealing member may be provided in a first pressing state in the attachment operation and the clamping operation and is provided in a second pressing state after the driving force is released, and the first pressing state may be a pressing state that is greater than the second pressing state.

The substrate treating apparatus may further include a controller configured to control the elevation member and the movable member, the elevation member may further include a driver configured to elevate the upper body or the lower body, the controller may control the driver and the movable member to perform an attachment operation of providing a driving force to the driver such that the lower body and the upper body are attached to each other if the substrate is introduced into the treatment space and a clamping operation of, after the attachment operation, clamping the upper body and the lower body attached to each other by the driving force with the clamping member, and the process for the substrate may be performed while a driving force is continuously provided to the driver after the clamping operation.

The substrate treating apparatus may further include a controller configured to control the elevation member and the movable member, the elevation member may further include a driver configured to elevate the upper body or the lower body, the controller may control the driver and the movable member to perform an attachment operation of providing a driving force to the driver such that the lower body and the upper body are attached to each other if the substrate is introduced into the treatment space, a clamping operation of, after the attachment operation, clamping the upper body and the lower body attached to each other by the driving force with the clamping member, and a substrate treating operation of, after the clamping operation, supplying a treatment liquid to the treatment space, and if the treatment space reaches a preset pressure due to a treatment fluid in the substrate treating operation, the driving force of the driver may be released while the clamping is made.

The first clamp may be provided such that one side surface thereof contacting the second clamp is stepped, the second clamp may be provided such that an opposite side surface thereof contacting the first clamp is stepped to correspond to the one side surface thereof, a first pin groove, into which a locking pin is inserted, may be formed in one of a stepped area of the first clamp and a stepped area of the second clamp, and a second pin groove may be formed on the other thereof, the first pin groove and the second groove may face each other at the locking location, and the first pin groove and the second pin groove may be located to be opposite to each other in a direction that is perpendicular to movement directions of the first clamp and the second clamp.

The substrate treating apparatus may further include a heating member configured to heat the treatment space, the heating member may further include a heater located in at least one of the upper body and the lower body and having a bar shape, a lengthwise direction of which faces a direction that is perpendicular to a movement direction of the clamping member.

In accordance with another aspect of the inventive concept, there is provided a method for treating a substrate by using a substrate treating apparatus, the method including an attachment operation of attaching the lower body and the upper body if the substrate is introduced into the treatment space, a clamping operation of clamping the upper body and the lower body attached to each other after the attachment operation, with the clamping member, and a substrate treating operation of treating the substrate in the treatment space after the clamping operation.

In the attachment operation and the clamping operation, the upper body and the lower body may be attached to each other by a driving force provided to the driver of the elevation member, and the driving force may be released in the substrate treating operation.

In the attachment operation, the clamping operation, and the substrate treating operation, the upper body and the lower body may be attached to each other by the driving force provided to the driver of the elevation member.

In the attachment operation and the clamping operation, the upper body and the lower body may be attached to each other by a driving force provided to the driver of the elevation member, and wherein in the substrate treating operation, the treatment space supplies the treatment fluid, and if the treatment space reaches a preset pressure, the driving force of the driver may be released.

In the substrate treating operation, the substrate may be treated by using a supercritical fluid. The substrate treating operation may include a drying process of drying the substrate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
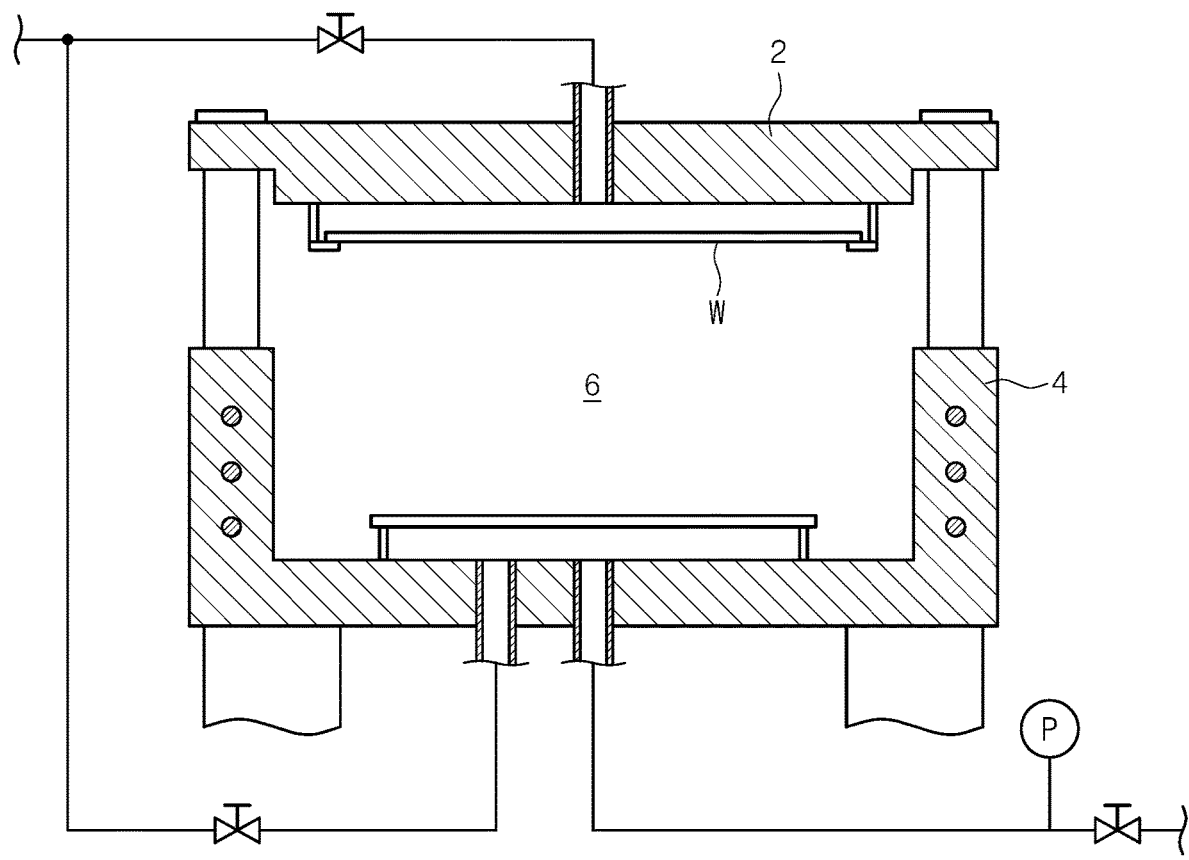
FIG. 1 is a sectional view illustrating a conventional supercritical treatment apparatus.

The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

An embodiment of the inventive concept will be described with reference to FIGS. 2 to 24.

Figure 2:
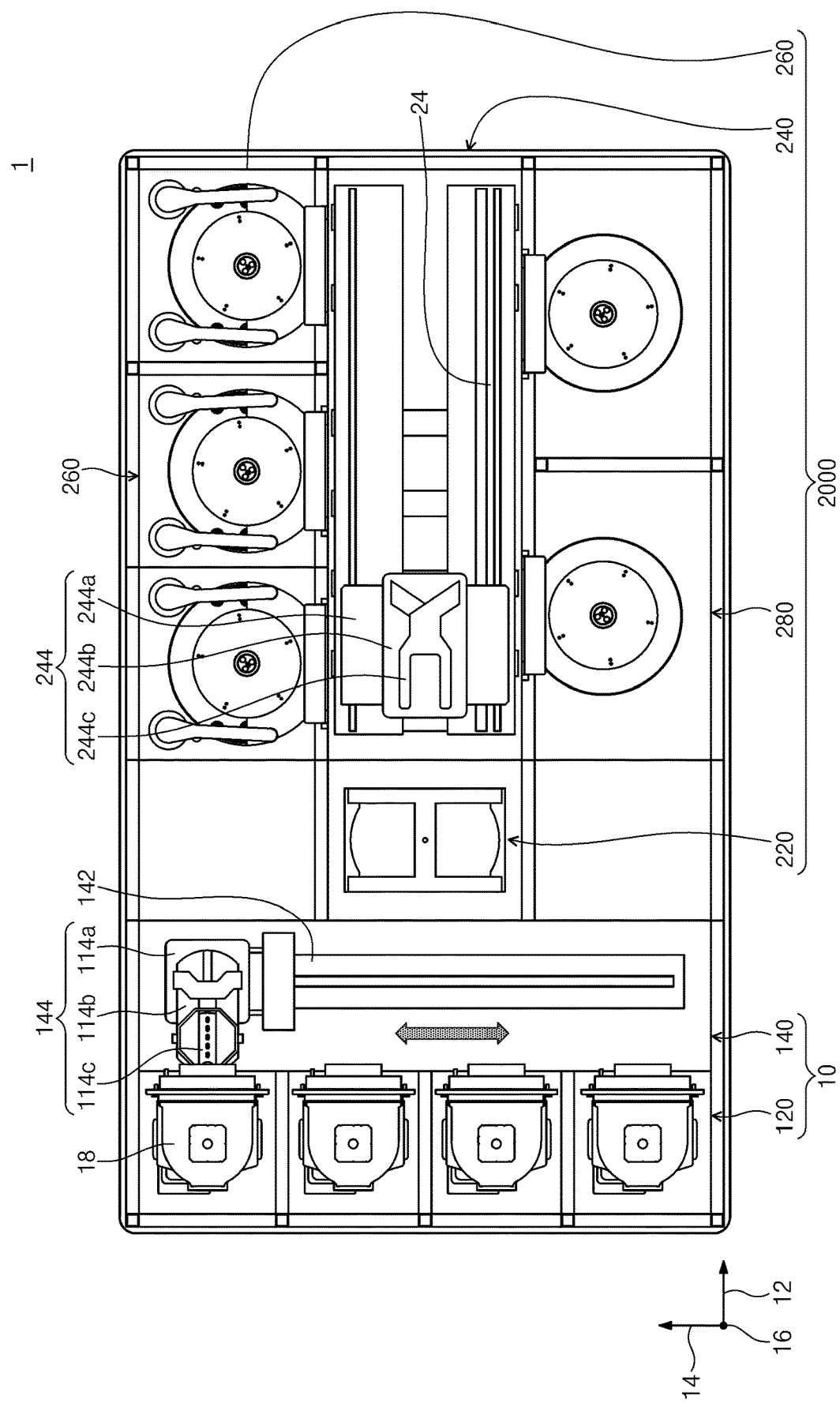
FIG. 2 is a plan view illustrating a substrate treating system according to a first embodiment of the inventive concept.

FIG. 2 is a plan view illustrating a substrate treating system according to a first embodiment of the inventive concept.

Referring to FIG. 2, the substrate treating system 1 has an index module 10 and a process treating module 2000, and the index module 10 includes a plurality of load ports 120 and a feeding frame 140. The load ports 120, the feeding frame 140, and the process treating module 2000 may be sequentially arranged in a row. Hereinafter, a direction in which the load ports 120, the feeding frame 140, and the process treating module 2000 are arranged will be referred to as a first direction 12, a direction that is perpendicular to the first direction 12 when viewed from the top will be referred to as a second direction 14, and a direction that is normal to a plane containing the first direction 12 and the second direction 14 will be referred to as a third direction 16.

A carrier 18, in which a substrate W is received, is seated on the load port 120. A plurality of load ports 120 are provided, and are arranged along the second direction 14 in a row. FIG. 1 illustrates that four load ports 120 are provided. However, the number of the load ports 120 may increase or decrease according to a condition, such as the process efficiency of the process treating module 2000 or a footprint. A plurality of slots (not illustrated) provided to support peripheries of substrates are formed in the carrier 18. A plurality of slots are provided along the third direction 16, and the substrate is situated in the carrier 18 such that the substrates are stacked to be spaced apart from each other along the third direction 16. A front opening unified pod (FOUP) may be used as the carrier 18.

The process treating module 2000 includes a buffer unit 220, a feeding chamber 240, a first process unit 260, and a second process unit 280. The feeding chamber 240 is disposed such that the lengthwise direction thereof is in parallel to the first direction 12. The first process units 260 are arranged on one side of the feeding chamber 240 along a second direction 14, and the second process units 280 are arranged on an opposite side of the feeding chamber 240 along the second direction 14. The first process units 260 and the second process units 280 may be arranged to be symmetrical to each other with respect to the feeding chamber 240. Some of the first process units 260 are arranged along the lengthwise direction of the feeding chamber 240. Furthermore, some of the first process units 260 are arranged to be stacked on each other. That is, the first process units 260 having an array of A by B (A and B are natural numbers) may be arranged on one side of the feeding chamber 240. Here, A is the number of the first process units 260 provided in a row along the first direction 12, and B is the number of the second process units 280 provided in a row along the third direction 16. When four or six first process units 260 are provided on one side of the feeding chamber 240, the first process units 260 may be arranged in an array of 2 by 2 or 3 by 2. The number of the first process units 260 may increase or decrease. Similarly to the first process units 260, the second process units 280 may be arranged in an array of M by N (M and N are natural numbers). Here, M and N may be same numbers as A and B. Unlike the above description, the first process units 260 and the second process units 280 may be provided only on one side of the feeding chamber 240. Further, unlike the above description, the first process units 260 and the second process units 280 may be provided on opposite sides of the feeding chamber 240 in a single layer. Further, unlike the above description, the first process units 260 and the second process units 280 may be provided in various arrangements.

The buffer unit 220 is disposed between the feeding frame 140 and the feeding chamber 240. The buffer unit 220 provides a space in which the substrates W stay before being transported, between the feeding chamber 240 and the feeding frame 140. Slots (not illustrated) in which the substrates W is positioned are provided in the buffer unit 220, and a plurality of slots (not illustrated) are provided to be spaced apart from each other along the third direction 16. A face of the buffer unit 220 that faces the feeding frame 140 and a face of the buffer unit 220 that faces the feeding chamber 240 are opened.

The feeding frame 140 transports the substrates W between the carrier 18 seated on the load port 120 and the buffer unit 220. An index rail 142 and an index robot 144 are provided in the feeding frame 140. The index rail 142 is provided such that the lengthwise direction thereof is in parallel to the second direction 14. The index robot 144 is installed on the index rail 142, and is linearly moved in the second direction 14 along the index rail 142. The index robot 144 has a base 114a, a body 114b, and a plurality of index arms 114c. The base 114a is installed to be moved along the index rail 142. The body 114b is coupled to the base 114a. The body 114b is provided to be moved along the third direction 16 on the base 114a. The body 114b is provided to be rotated on the base 114a. The index arms 114c are coupled to the body 114b, and are provided to be moved forwards and rearwards with respect to the body 114b. A plurality of index arms 114c are provided to be driven individually. The index arms 144c are disposed to be stacked so as to be spaced apart from each other along the third direction 16. Some of the index arms 114c are used when the substrates W are transported to the carrier 18 in the process module 20, and some of the index arms 114c may be used when the substrates W are transported from the carrier 18 to the process treating module 2000. This structure may prevent particles generated from the substrates W before the process treatment from being attached to the substrates W after the process treatment in the process of carrying the substrates W in and out by the index robot 144.

The feeding chamber 240 transfers the substrate W between any two of the buffer unit 220, the first process units 260, and the second process units 280. A guide rail 24 and a main robot 244 are provided in the feeding chamber 240. The guide rail 24 is disposed such that the lengthwise direction thereof is parallel to the first direction 12. The main robot 244 is installed on the guide rail 24, and is linearly moved along the first direction 12 on the index rail 142.

The first process unit 260 and the second process unit 280 may sequentially perform a process on one substrate W. For example, the substrate W may perform a chemical process, a rinsing process, and a primary drying process in the first process unit 260, and may perform a secondary drying process in the second process unit 280. In this case, the primary driving drying process may be performed by an organic solvent, and the secondary drying process may be performed by a supercritical fluid. An isopropyl alcohol (IPA) liquid may be used as an organic solvent, and carbon dioxide ($CO_2$) may be used as a supercritical fluid. Unlike this, the primary drying process may be excluded by the first process unit 260.

Figure 3:
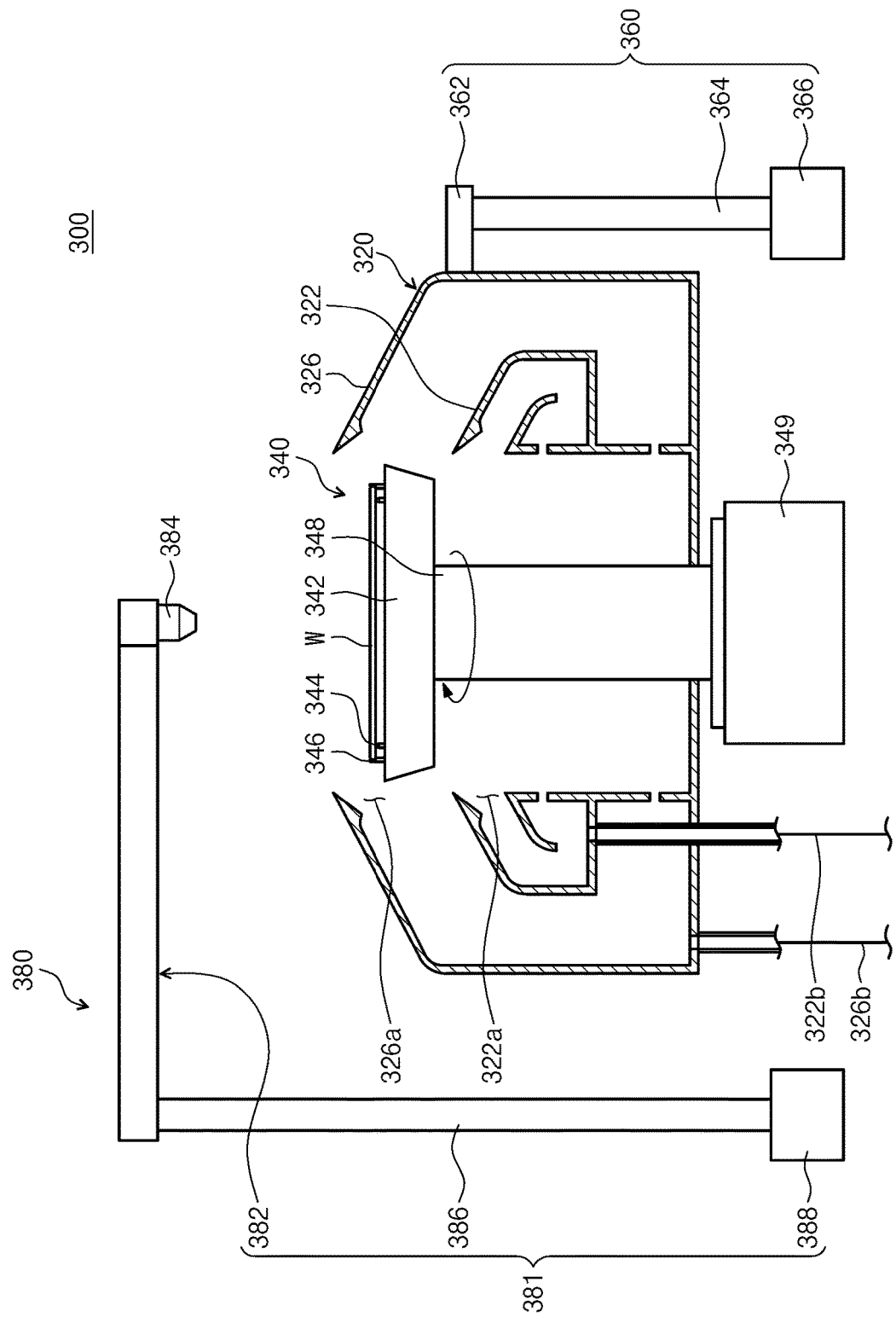
FIG. 3 is a sectional view illustrating an apparatus for cleaning a substrate in a first process unit of FIG. 2.

Hereinafter, a substrate treating apparatus 300 provided in the first process unit 260 will be described. FIG. 3 is a sectional view illustrating an apparatus for cleaning a substrate in a first process unit of FIG. 2. Referring to FIG. 3, the substrate treating apparatus 300 includes a treatment container 320, a spin head 340, an elevation unit 360, and an ejection member 380. The treatment container 320 provides a space in which a substrate treating process is performed, and an upper side of the treatment container 320 is opened. The treatment container 320 includes an inner recovery vessel 322 and an outer recovery vessel 326. The recovery vessels 322 and 326 recover different treatment liquids used in the process. The inner recovery vessel 322 is provided to have an annular ring shape that surrounds the spin head 340, and the outer recovery vessel 326 is provided to have an annular ring shape that surrounds the inner recovery vessel 322. An inner space 322a of the inner recovery vessel 322 and a space 326a between the outer recovery vessel 326 and the inner recovery vessel 322 function as inlets, through which the treatment liquid is introduced into the inner recovery vessel 322 and the outer recovery vessel 326, respectively. Recovery lines 322b and 326b extending from the recovery vessels 322 and 326 perpendicularly in the downward direction of the bottom surfaces thereof are connected to the recovery vessels 322 and 326, respectively. The recovery lines 322b and 326b discharge the treatment liquids introduced through the recovery vessels 322 and 326, respectively. The discharged treatment liquids may be reused through an external treatment liquid recycling system (not illustrated).

The spin head 340 is arranged in the treatment container 320. The spin head 340 supports and rotates the substrate W during the process. The spin head 340 has a body 342, a plurality of support pins 344, a plurality of chuck pins 346, and a support shaft 348. The body 342 has an upper surface having a substantially circular shape when viewed from the top. The support shaft 348 that may be rotated by a motor 349 is fixedly coupled to the bottom of the body 342. A plurality of support pins 344 are provided. The support pins 344 may be arranged to be spaced apart from each other at a periphery of the upper surface of the body 342 and protrude upwards from the body 342. The support pins 344 are arranged to have a generally annular ring shape through combination thereof. The support pins 344 support a periphery of a rear surface of the substrate such that the substrate W is spaced apart from the upper surface of the body 342 by a predetermined distance. A plurality of chuck pins 346 are provided. The chuck pins 346 are arranged to be more distant from the center of the body 342 than the support pins 344. The chuck pins 346 are provided to protrude upwards from the body 342. The chuck pins 346 support a side of the substrate W such that the substrate W is not separated laterally from a proper place when the spin head 340 is rotated. The chuck pins 346 are provided to be linearly moved between a standby position and a support position along a radial direction of the body 342. The standby position is a position that is more distant from the center of the body 342 than the support position. When the substrate W is loaded on or unloaded from the spin head 340, the chuck pins 346 are located at the standby position, and when a process is performed on the substrate W, the chuck pins 346 are located at the support position. The chuck pins 346 are in contact with the side of the substrate W at the support position.

The elevation unit 360 linearly moves the container 320 upwards and downwards. When the container 320 is moved upwards and downwards, a relative height of the container 320 to the spin head 340 is changed. The elevation unit 360 has a bracket 362, a movable shaft 364, and a driver 366. The bracket 362 is fixedly installed on an outer wall of the container 320, and the movable shaft 364 that is moved upwards and downwards by the driver 366 is fixedly coupled to the bracket 362. The treatment container 320 is lowered such that, when the substrate W is positioned on the spin head 340 or is lifted from the spin head 340, the spin head 340 protrudes to the upper side of the treatment container 320. When the process is performed, the height of the container 320 is adjusted such that the treatment liquid is introduced into the elevation unit 360 according to the kind of the treatment liquid supplied to the substrate W.

Unlike those described above, the elevation unit 360 may move the spin head 340, instead of the treatment container 320, upwards and downwards.

The ejection member 380 supplies the treatment liquid onto the substrate W. The injection member 380 has a nozzle support 382, a nozzle 384, a support shaft 386, and a driver 388. The lengthwise direction of the support shaft 386 is provided along the third direction 16, and the driver 388 is coupled to a lower end of the support shaft 386. The driver 388 rotates and elevates the support shaft 386. The nozzle support 382 is coupled to an end of the support shaft 386, which is opposite to an end of the support shaft 386 coupled to the driver 388, perpendicularly to the support 386. The nozzle 384 is installed on a bottom surface of an end of the nozzle support 382. The nozzle 384 is moved to a process location and a standby location by the driver 388. The process location is a location at which the nozzle 384 is arranged at a vertical upper portion of the treatment container 320, and the standby location is a location that deviates from the vertical upper portion of the treatment container 320. One or a plurality of ejection members 380 may be provided. When a plurality of ejection members 380 are provided, the chemical, the rinsing liquid, and the organic solvent may be provided through different ejection members 380. The chemical may be a liquid having a strong acid or alkali property. The rinsing liquid may be pure water. The organic solvent may be a mixture of vapor of isopropyl alcohol and an inert gas or a isopropyl alcohol liquid.

Figure 4:
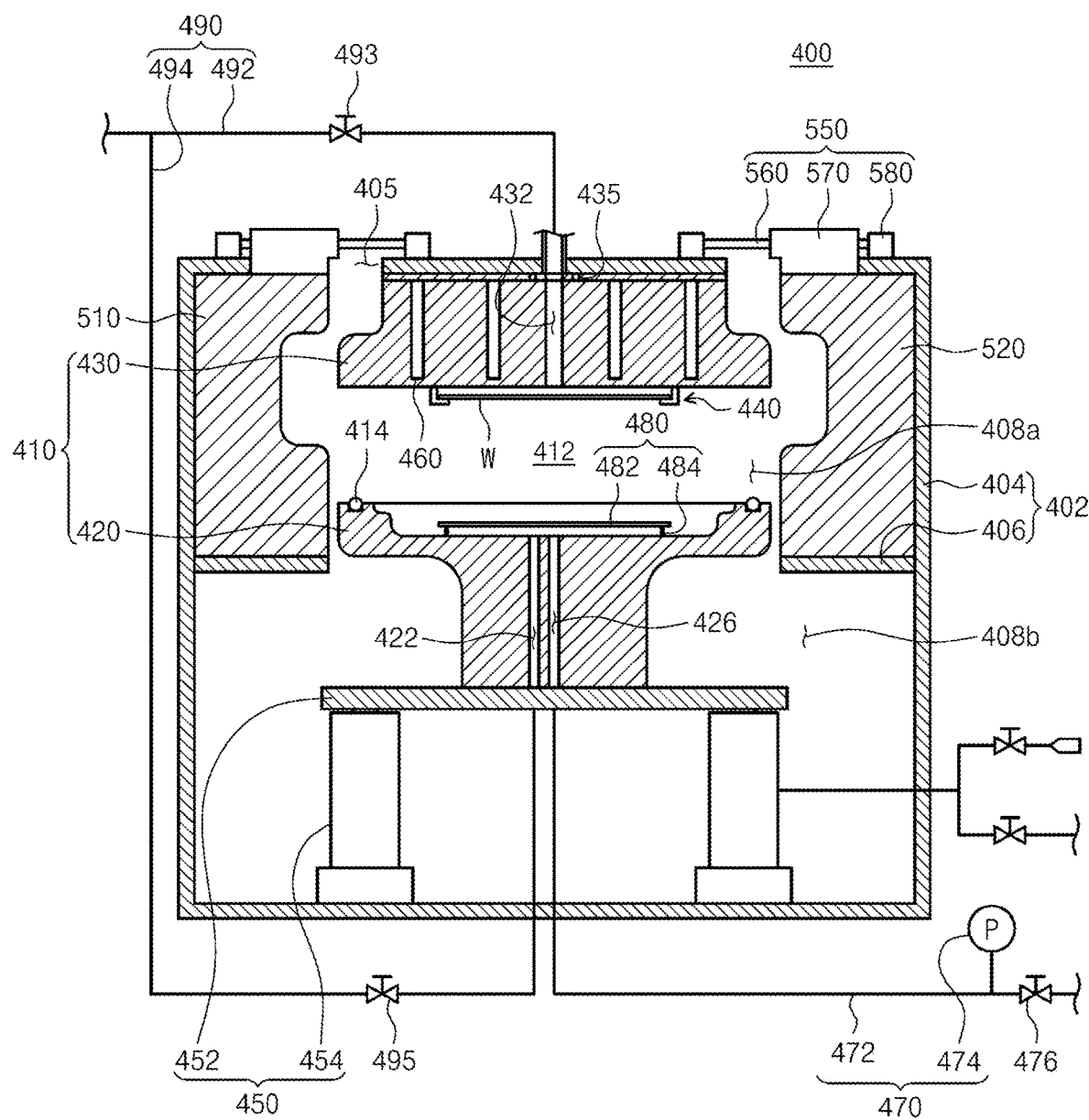
FIG. 4 is a sectional view illustrating an apparatus for drying a substrate in a second process unit of FIG. 2.
Figure 5:
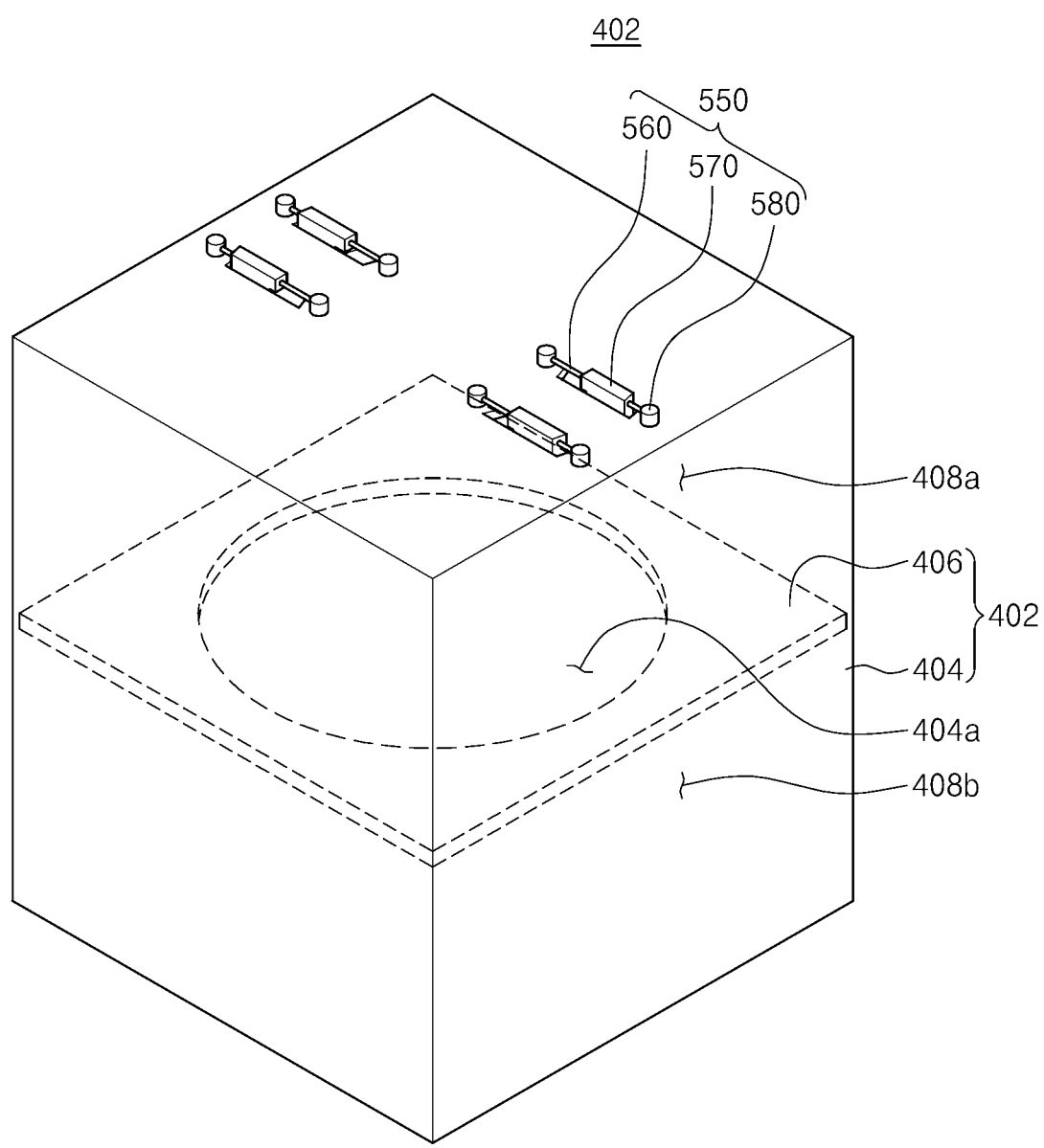
FIG. 5 is a perspective view illustrating a housing of FIG. 4.

A substrate treating apparatus 400 that performs a secondary drying process of the substrate W is provided in the second process unit 280. The substrate treating apparatus 400 secondarily dries the substrate W primarily dried in the first process unit 260. The substrate treating apparatus 400 dries the substrate W, on which the organic solvent resides. The substrate treating apparatus 400 may dry the substrate W by using a supercritical solvent. FIG. 4 is a sectional view illustrating an apparatus for drying a substrate in a second process unit of FIG. 2. FIG. 5 is a perspective view illustrating a housing of FIG. 4. Referring to FIGS. 4 and 5, the substrate treating apparatus 400 includes a housing 402, a process chamber 410, a substrate support unit 440, an elevation member 450, a heating member 460, a blocking member 480, an exhaustion unit 470, a fluid supply unit 490, a clamping member 500, a movable member 550, and a controller not shown.

The housing 402 includes a body 404 and an intermediate plate 406. The body 404 has a tub shape having a space therein. For example, the body 404 may be provided to have a hexahedral shape. Through-holes 405 having a slit shape are formed on an upper surface of the body 404. The through-holes 405 have the same lengthwise direction at different locations. According to an example, four through-holes 405 are provided such that two of them are located on one side and the other two of them are located on an opposite side. Selectively, an even number of through-holes 405 are provided, and the number of the through-holes 405 may be two or six. The through-holes 405 function as passages that connect the movable member 550 and the clamping member 500.

The intermediate plate 406 is located in the body 404. The intermediate plate 406 partitions the interior of the body 404 into an upper space 408a and a lower space 408b. The intermediate plate 406 has a plate shape having a hollow 404a. The hollow 404a is provided such that the lower body 420 may be inserted into the hollow 404a. The hollow 404a may have a diameter that is larger than a lower end of the lower body 420. The process chamber 410 and the clamping member 500 are located in the upper space 408a, and the elevation member 450 may be located in the lower space 408b. The movable member 550 may be located on an outer wall of the housing 402.

The process chamber 410 defines a treatment space 412 for treating the substrate W therein. The process chamber 410 closes the treatment space 412 from the outside while the substrate W is treated. The process chamber 410 includes a lower body 420, an upper body 430, and a sealing member 414. A bottom surface of the lower body 420 may be stepped. The lower body 420 may be located such that a central portion of a bottom surface of the lower body 420 is lower than a peripheral portion of the lower body 420. For example, the lower body 420 may have a substantially cylindrical shape. The lower body 420 may be elevated to the upper space 408a and the lower space 408b of the body 404 by the elevation member 450. A lower supply port 422 and an exhaustion port 426 are formed on a bottom surface of the lower body 420. When viewed from the top, the lower supply port 422 may deviate from a central axis of the lower body 420. The lower supply port 422 functions as a passage, through which the supercritical fluid is supplied to the treatment space 412.

The upper body 430 is combined with the lower body 420 to define a treatment space 412 therebetween. The upper body 430 is located above the lower body 420. The upper body 430 is located in the upper space 408a of the housing 402. The upper body 430 is coupled to a ceiling surface of the body 404 by an impact absorbing member 435. The impact absorbing member 435 may be formed of an elastic material. The impact absorbing member 435 may be a leaf spring or a coil spring. For example, the impact absorbing member 435 may be a spring. A side end of the upper body 430 may be stepped. The upper body 430 is shaped such that a central portion of an upper surface of the upper body 430 is higher than a peripheral portion of the upper body 430. For example, the upper body 430 may have a substantially cylindrical shape. An upper supply port 432 is formed in the upper body 430. The upper supply port 432 functions as a passage, through which the supercritical fluid is supplied to the treatment space 412. The upper supply port 432 may be located to coincide with the center of the upper body 430. According to an example, the upper body 430 and the lower body 420 are formed of a metallic material.

The sealing member 414 seals an aperture between the upper body 430 and the lower body 420. The sealing member 414 is located between the upper body 430 and the lower body 420. The sealing member 414 has an annular ring shape. For example, the sealing member 414 may be an O-ring 414. The sealing member 414 is provided on a lower end surface of the upper body 430 or an upper end surface of the lower body 420. In the embodiment, it will be described that the sealing member 414 is provided on an upper end surface of the lower body 420. A sealing groove, into which the sealing member 414 is inserted, is formed on an upper end surface of the lower body. A portion of the sealing member 414 is inserted into the sealing groove, and another portion of the sealing member 414 protrudes from the sealing groove. The sealing member 414 may be formed of an elastic material.

Figure 6:
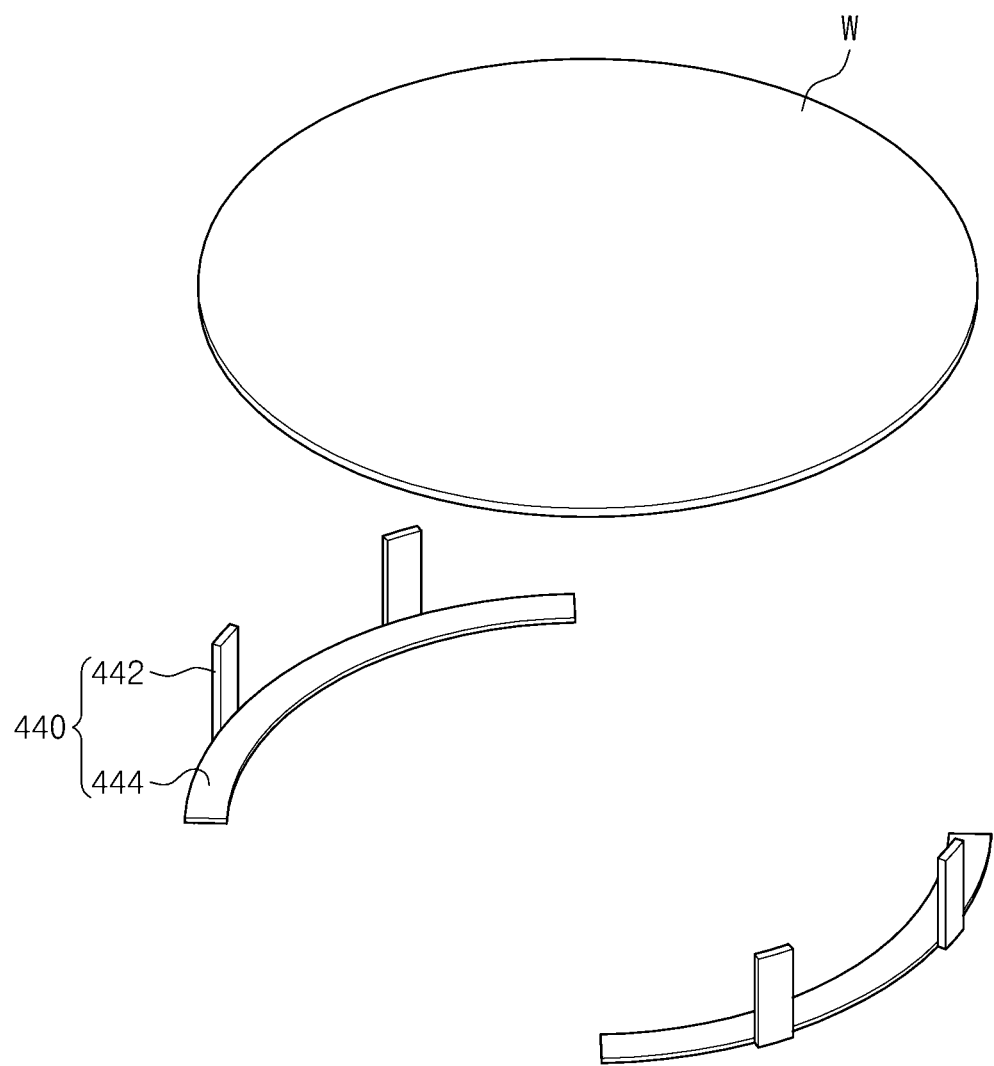
FIG. 6 is a perspective view illustrating a substrate support unit of FIG. 4.

The substrate supporting unit 440 supports the substrate W in the treatment space 412. FIG. 6 is a perspective view illustrating a substrate support unit of FIG. 4. Referring to FIG. 6, the substrate support unit 440 supports the substrate W such that a treatment surface of the substrate W faces the upper side. The substrate support unit 440 includes a support member 442 and a substrate maintaining member 444. The support 442 has a bar shape that extends downwards from a bottom surface of the upper body 430. A plurality of support members 442 is provided. For example, four support members 442 may be provided. The substrate maintaining member 444 supports a peripheral area of a bottom surface of the substrate W. A plurality of substrate maintaining members 444 are provided, and support different areas of the substrate W. For example, two substrate maintaining members 444 may be provided. When viewed from the top, the substrate maintaining member 444 has a rounded plate shape. When viewed from the top, the substrate maintaining member 444 is located inside the support member. The substrate maintaining members 444 are combined with each other to have a ring shape. The substrate maintaining members 444 are spaced apart from each other.

Referring back to FIGS. 4 and 5, the elevation member 450 adjusts a relative location between the upper body 430 and the lower body 420. The elevation member 450 elevates the upper body 430 and the lower body 420 such that any one of the upper body 430 and the lower body 420 is separated from or attached to the other thereof. The elevation member 450 elevates any one of the upper body 430 and the lower body 420 such that the process chamber 410 may be moved to an opening location or a closing location. Here, the opening location is a location at which the upper body 430 and the lower body 420 are spaced apart from each other, and the closing location is a location at which the upper body 430 and the lower body 420 are attached to each other to contract each other. That is, the treatment space 412 is opened to the outside at the opening location, and the treatment space 412 is closed from the outside at the closing location. In the embodiment, it will be described that the elevation member 450 elevates the lower body 420 in the lower space 408b and the location of the upper body 430 is fixed. Selectively, the lower body 420 is fixed, and the upper body 430 may elevate with respect to the lower body 420. In this case, the elevation member 450 may be located in the upper space 408a.

The elevation member 450 includes a support plate 452, an elevation shaft 454, and a driver 456. The support plate 452 supports the lower body 420 in the lower space 408b. The lower body 420 is fixedly coupled to the support plate 452. The support plate 452 has a circular disk shape. The support plate 452 has a diameter that is larger than that of the hollow 404a. Accordingly, a lower end of the lower body 420 is located in the lower space 408b even at the closing location. The elevation shaft 454 supports a bottom surface of the support plate 452 in the lower space 408b. The elevation shaft 454 is fixedly coupled to the support plate 452. A plurality of elevation shafts 454 is provided. The elevation shafts 454 are arranged circumferentially. The driver 456 elevates the elevation shafts 454. A plurality of drivers 456 are coupled to the elevation shafts 454 in one-to-one correspondence. A driving force is provided to the driver 456, the lower body 420 and the elevation shaft 454 are elevated and the upper body 430 and the lower body 420 are moved to a closing location at which the treatment space is closed. If the driving force of the driver 456 is released at the closing location, the upper body 430 and the lower body 420 may maintain their closing locations. The drivers 456 may be provided with the same driving force, or the driving force may be released from the drivers 456 in the same way. Accordingly, the plurality of elevation shafts 454 are located at the same height during the elevation thereof, and the support plate 452 and the lower body 420 may elevate while maintaining their horizontal states. For example, the driver 456 may be a cylinder or a motor.

Selectively, if the driving force of the driver 456 is released at the closing location, the lower body 420 and the elevation shaft 454 are lowered and the upper body 430 and the lower body 420 may be moved to an opening location at which the treatment space is opened.

The heating member 460 heats the treatment space 412. The heating member 460 heats the supercritical fluid supplied to the treatment space 412 to a critical temperature or higher to maintain a phase of the supercritical fluid. The heating member 460 includes a plurality of heaters 460. The heaters 460 have bar or rod shapes having parallel lengthwise directions. The heaters 460 may have a lengthwise direction that is perpendicular to the direction in which clamps 510 and 520 are moved. For example, the heaters 460 have lengthwise directions that are parallel to the direction in which the bodies 420 and 430 are moved. Because sides of the bodies 420 and 430 are clamped, it is impossible to insert the heater 460 from side surfaces of the bodies 420 and 430. The heaters 460 may be buried and installed in at least one wall of the upper body 430 and the lower body 420. For example, the heaters may receive electric power from the outside to generate heat. Although it has been described in the embodiment that the heaters 460 are provided to the upper body 430, the heaters 460 may be provided to the upper body 430 and the lower body 420. Further, the heaters 460 may not be provided to the upper body 430 but to the lower body 420.

The blocking member 480 prevents the supercritical fluid supplied from the exhaust port 474 from being directly supplied to a non-treatment surface of the substrate W. The blocking member 480 may include a blocking plate 482 and a support 484. The blocking plate 482 is located between the exhaust port 474 and the substrate support unit 440. The blocking plate 482 has a disk shape. The blocking plate 482 has a diameter that is smaller than an inner diameter of the lower body 420. When viewed from the top, the blocking plate 482 has a diameter by which both of the exhaust port 474 and the exhaustion port 426 are covered. For example, the blocking plate 482 may correspond to the diameter of the substrate W or have a larger diameter. The support 484 supports the blocking plate 482. A plurality of supports 484 are provided to be arranged along a circumferential direction of the blocking plate 482. The supports 484 are arranged to be spaced apart from each other by a specific interval.

The exhaustion unit 470 exhausts the atmosphere of the treatment space 412. The process side-products generated in the treatment space 412 are exhausted through the exhaustion unit 470. The exhaustion may be natural exhaustion or compulsory exhaustion. Further, the exhaustion unit 470 may adjust a pressure of the treatment space 412 while exhausting the process side-products. The exhaustion unit 470 includes an exhaust line 472 and a pressure measuring member 474. The exhaust line 472 is connected to the exhaust port 426. An exhaust valve 476 installed in the exhaust line 472 may adjust an amount of exhaust gas of the treatment space 412. The pressure measuring member 474 is installed in the exhaust line 472 to measure a pressure of the exhaust line 472. The pressure measuring member 474 is located on an upstream side of the exhaust valve 476 with respect to an exhaustion direction. The pressure of the treatment space 412 may be reduced to an atmospheric pressure or a pressure corresponding to the outside of the process chamber 410 by the exhaustion unit 470.

The fluid supply unit 490 supplies a treatment fluid to the treatment space 412. The treatment space is supplied in a supercritical state by a supercritical temperature and a supercritical pressure. The fluid supply unit 490 includes an upper supply line 492 and a lower supply line 494. The upper supply line 492 is connected to the upper supply port 432. The treatment fluid is supplied to the treatment space 412 sequentially via the upper supply line 492 and the upper supply port 432. An upper valve 493 is installed in the upper supply line 492. The upper valve 493 opens and closes the upper supply line 492. The lower supply line 494 connects the upper supply line 492 and the lower supply port 422. The lower supply line 494 is branched from the upper supply line 492 and is connected to the lower supply port 422. That is, the treatment fluids supplied from the upper supply line 492 and the lower supply line 494 may be the same kind of fluid. The treatment fluid is supplied to the treatment space 412 sequentially via the lower supply line 494 and the lower supply port 422. A lower valve 495 is installed in the lower supply line 494. The lower valve 495 opens and closes the lower supply line 494.

According to an embodiment, a treatment fluid may be supplied from a lower supply port 422 facing a non-treatment surface of the substrate W, and then the treatment fluid may be supplied from an upper supply port 432 facing a treatment surface of the substrate W. Accordingly, the treatment fluid may be supplied to the treatment space 412 through the lower supply line 494, and then may be supplied to the treatment space 412 through the upper supply line 492. This is because the initially supplied treatment fluid may be prevented from being supplied to the substrate W while not reaching a threshold pressure or a threshold temperature.

The clamping member 500 clamps the upper body 430 and the lower body 420 located at the closing location. Accordingly, even though the pressure in the treatment space is raised during the process, an aperture may be prevented from being generated between the upper body 430 and the lower body 420. Further, while the process chamber 410 is clamped by the clamping member 500, the driving force of the driver is released. Accordingly, a strong force is applied to the driver 456 for a long time, and the driver 456 may be prevented from being damaged.

Figure 7:
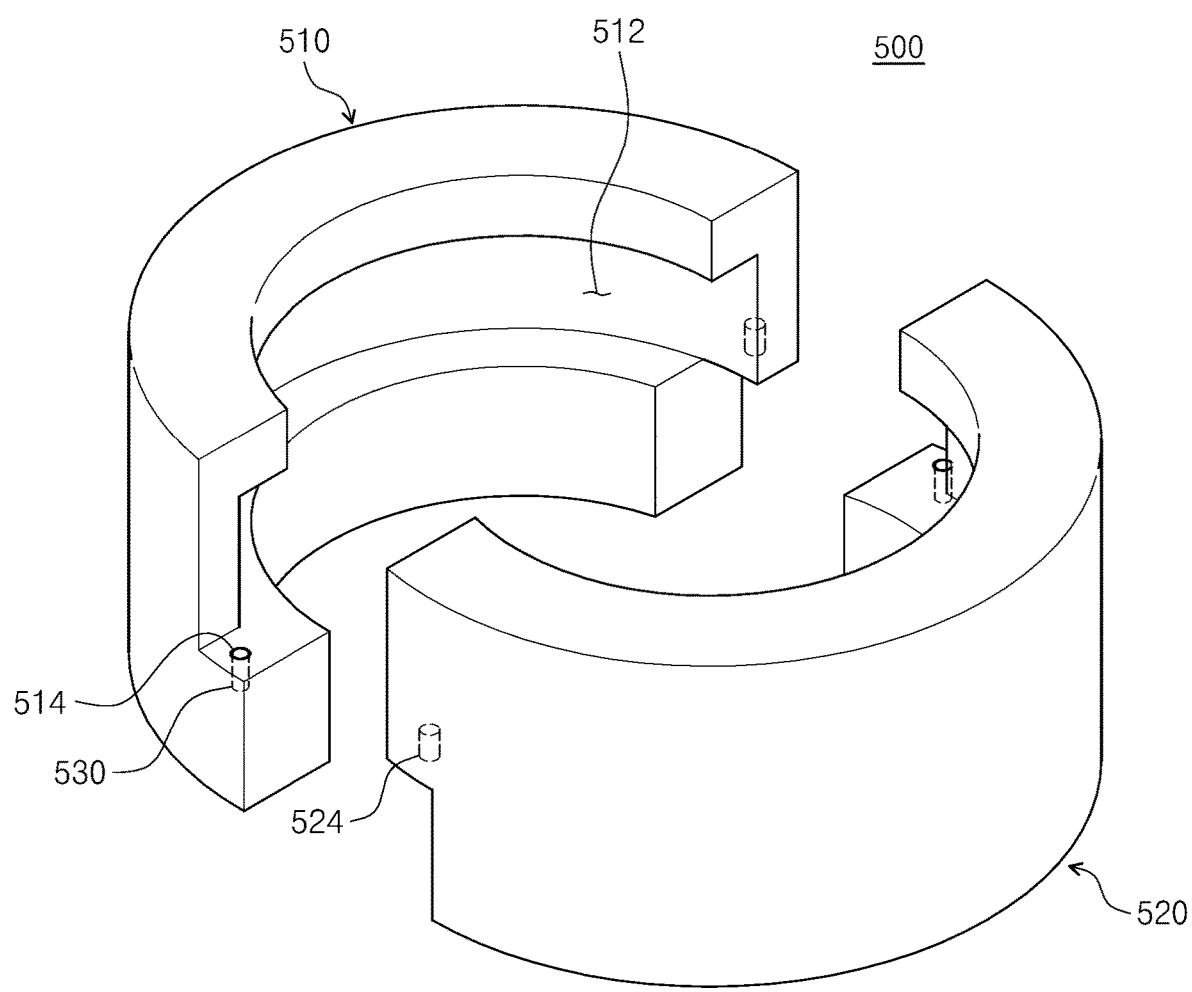
FIG. 7 is a perspective view illustrating a clamping member of FIG. 4.

FIG. 7 is a perspective view illustrating a clamping member of FIG. 4. Referring to FIG. 7, the clamping member 500 includes a first clamp 510, a second clamp 520, and a locking pin 530. The first clamp 510 and the second clamp 520 are located at sides of the process chamber 410. According to an embodiment, the first clamp 510 and the second clamp 520 face each other while the process chamber 410 being interposed therebetween. The first clamp 510 and the second clamp 520 are shaped to surround the process chamber 410. Each of the first clamp 510 and the second clamp 520 has a clamp groove 512 on inner surfaces thereof, which face the process chamber 410. A peripheral portion of the upper body 430 and a peripheral portion of the lower body 420 at the closing location may be inserted into the clamp grooves 512. The clamping member 500 may be moved to a locking location or a releasing location. Here, the locking location is defined as a location at which the first clamp 510 and the second clamp 520 become close to each other to clamp the upper body 430 and the lower body 420 and the releasing location is defines as a location at which the first clamp 510 and the second clamp 520 are spaced apart from the upper body 430 and the lower body 420. The first clamp 510 and the second clamp 520 are combined with each other at the locking location to have an annular ring shape. For example, a vertical section of any one of the first clamp 510 and the second clamp 520 has a "C" or "stapler" shape, and a vertical section of the other of the first clamp 510 and the second clamp 520 may be symmetrical to the first vertical section with respect to the vertical axis.

One side surface of the first clamp 510, which contacts the second clamp 520, is stepped. An opposite side surface of the second clamp 520, which contacts the first clamp 510, is stepped. The one side surface of the first clamp 510 and the opposite side surface of the second clamp 520 may miss each other. According to an example, one side surface of the first clamp 510 may be stepped such that an upper end thereof is longer than a lower end thereof, and an opposite side surface of the second clamp 520 may be stepped such that an upper end thereof is shorter than a lower end thereof. A first pin groove 514, in which a locking pin 530 is located, is formed in a stepped area of the first clamp 510, and a second pin groove 524 is formed in a stepped area of the second clamp 520. The first pin groove 514 and the second pin groove 524 face a direction that is perpendicular to the movement direction of the clamping member 500. At the locking location, the first pin groove 514 and the second pin groove 524 face each other. According to an example, at the locking location, the locking pin 530 may protrude from the first pin groove 514 to be inserted into the second pin groove 524. Further, the first pin groove 514 may be further formed in the second clamp 520, and the second pin groove 524 may be further formed in the first clamp 510.

Referring to FIGS. 4 and 5 again, the movable member 550 moves the clamping member 500 to the locking location and the release location. The movable member 550 moves the clamping member 500 to a direction that is perpendicular to the movement direction of the process chamber 410. The movable member 550 includes a guide rail 560, a bracket 570, and a driving member 580. The guide rail 560 is located outside the housing 402. The guide rail 560 is located adjacent to the upper space 408a, in which the upper body 430 is located. The guide rail 560 is installed on an upper surface of the housing 402. The lengthwise direction of the guide rail 560 is perpendicular to the movement direction of the process chamber 410. A plurality of guide rails 560 are provided and have the same lengthwise direction. According to an example, the number of the guide rails 560 is the same as the number of the through-holes 405. Lengthwise directions of the guide rails 560 may be parallel to the lengthwise directions of the through-holes 405. When viewed from the top, the guide rails 560 overlap the through-holes 405. The bracket 570 fixedly couples the guide rail 560 and the clamping member 500. The number of the brackets 570 is the same as the number of the guide rails 560. According to an example, when viewed from the top, the first clamp 510 may be connected to the guide rail 560 located on one side and the second clamp 520 may be connected to the guide rail located on an opposite side. The driving member 580 drives the guide rail 560 such that the clamping member 500 may be moved to a locking location or a release location according to the lengthwise direction of the guide rail 560.

The controller controls the elevation member 450 and the movable member 550. The controller controls the elevation member 450 such that the process chamber 410 may be moved to a closing location or an opening location, and controls the movable member 550 such that the clamping member 500 may be moved to a locking location or a release location. According to an example, the controller may move the clamping member 500 from the release location to the locking location if the process chamber 410 is moved from the opening location to the closing location. The controller may control the elevation member 450 such that the driving force of the driver 456 may be released if the process chamber 410 is closed by the clamping member 500.

Figure 18:
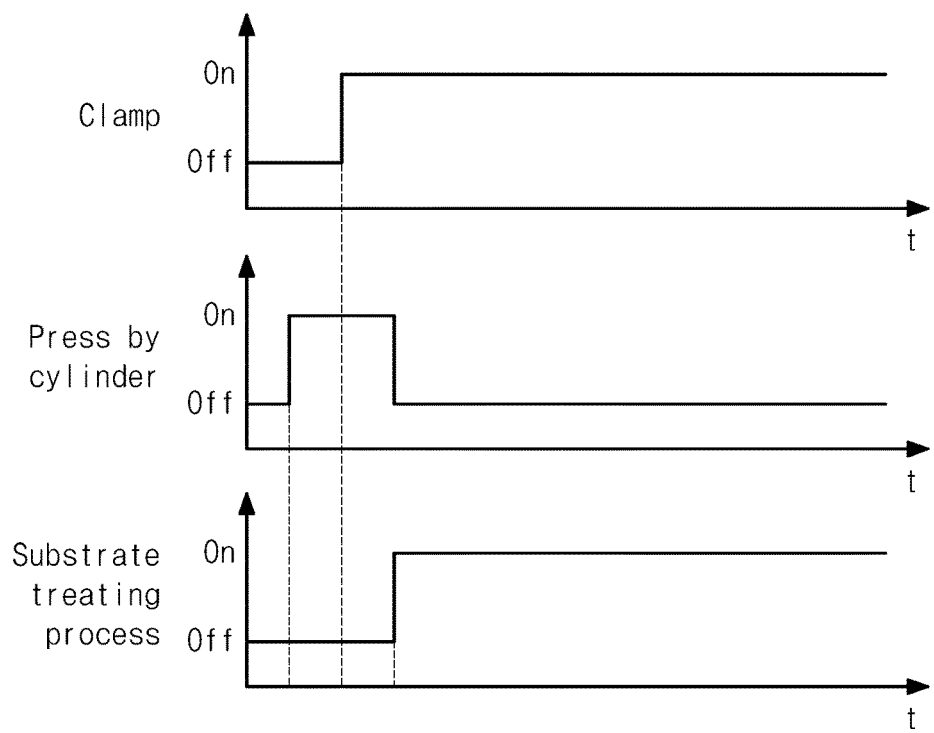
FIG. 18 is a graph depicting a relationship between the elevation member, the clamping member, and the substrate treating process during a process of treating the substrate in FIGS. 8 to 13.

Next, a method for treating a substrate by using the aforementioned substrate treating apparatus 400 will be described. FIGS. 8 to 17 are views illustrating a process of treating a substrate by using the apparatus of FIG. 4. FIG. 18 is a graph depicting a relationship between the elevation member, the clamping member, and the substrate treating process during a process of treating the substrate in FIGS. 8 to 13.

Referring to FIGS. 8 to 18, the substrate treating method includes a chamber closing operation, a substrate treating operation, and a chamber opening operation. The chamber closing operation is a process operation of closing a treatment space if a substrate W is carried into the process chamber 410. The chamber opening operation is a process operation of opening a treatment space 412 to carry the substrate W from the process chamber 410. The substrate treating operation is an operation of treating the substrate W in a supercritical way in the closed treatment space. Next, the chamber closing operation, the substrate treating operation, and the chamber opening operation will be described in more detail.

Figure 8:
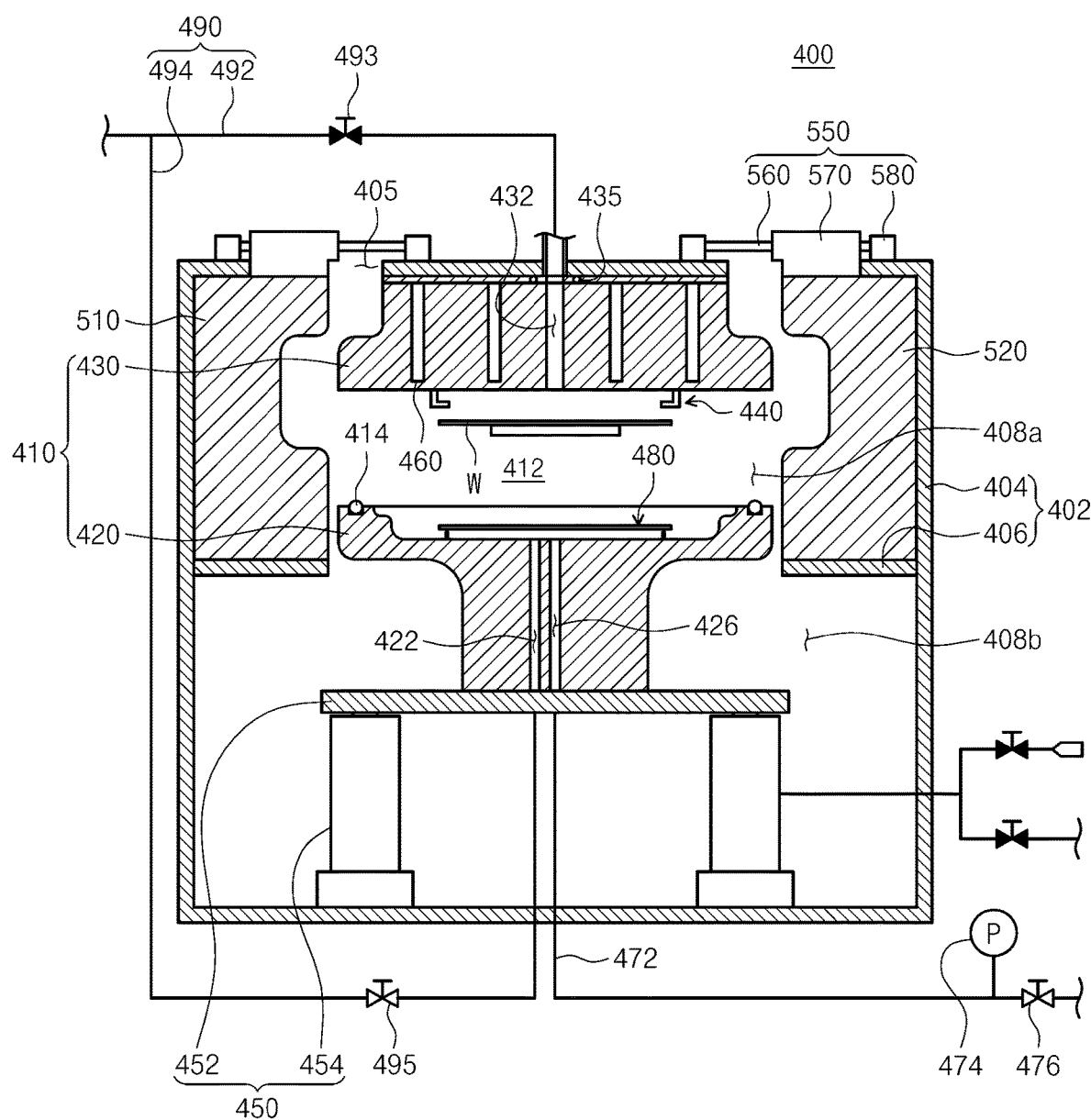
FIGS. 8 to 17 are views illustrating a process of treating a substrate by using the apparatus of FIG. 4.
Figure 9:
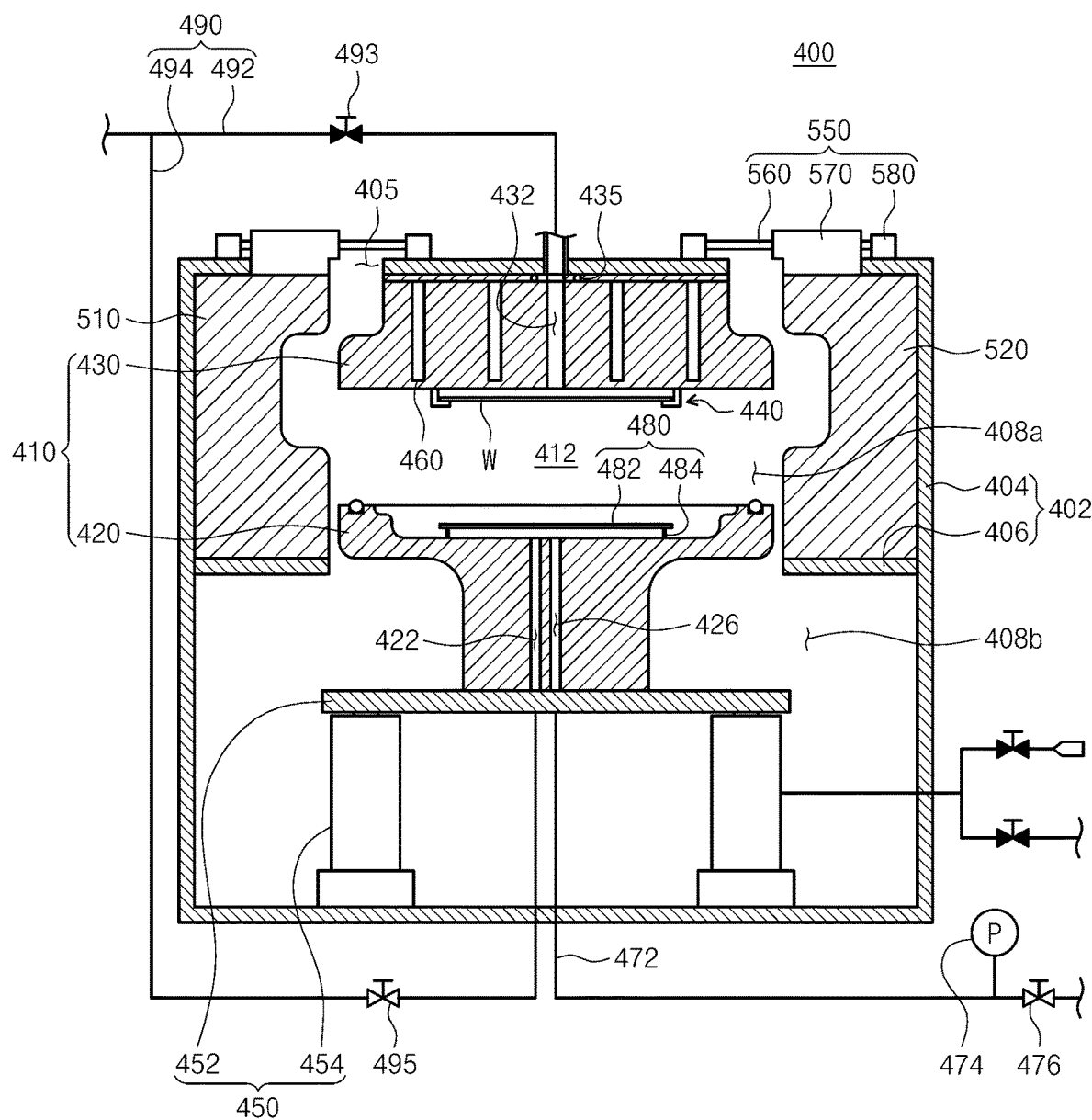
Figure 10:
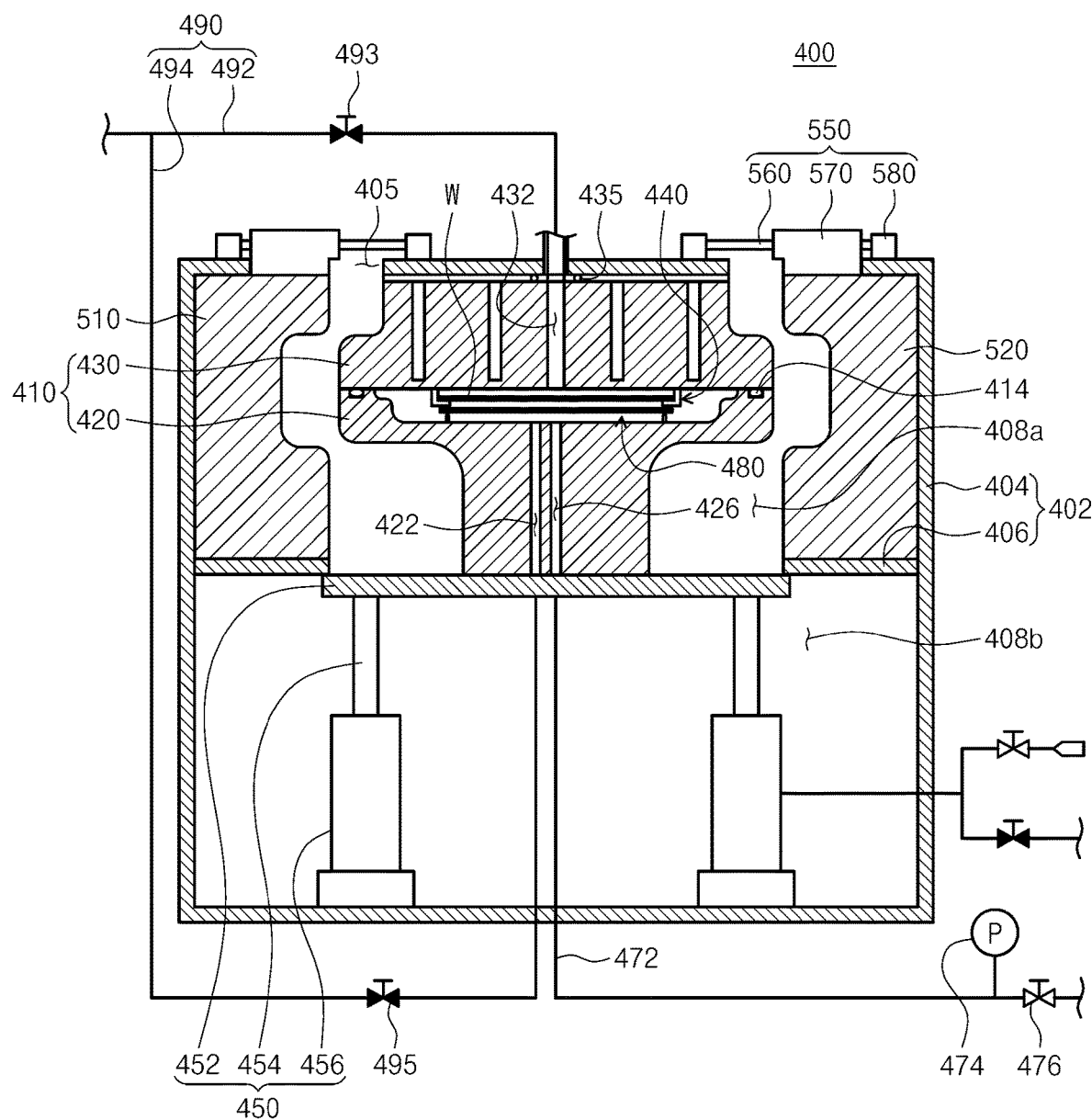
Figure 11:
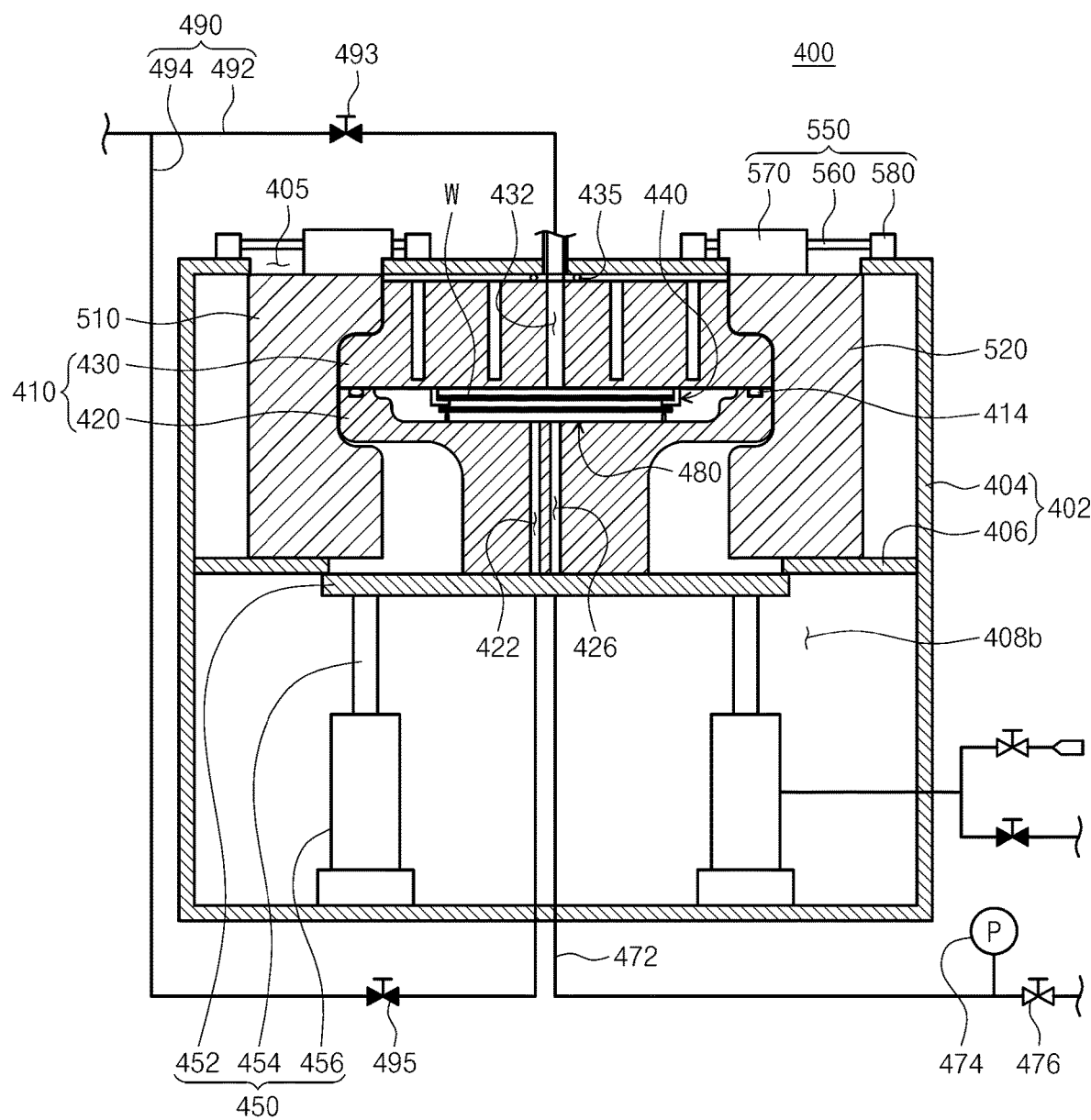
Figure 12:
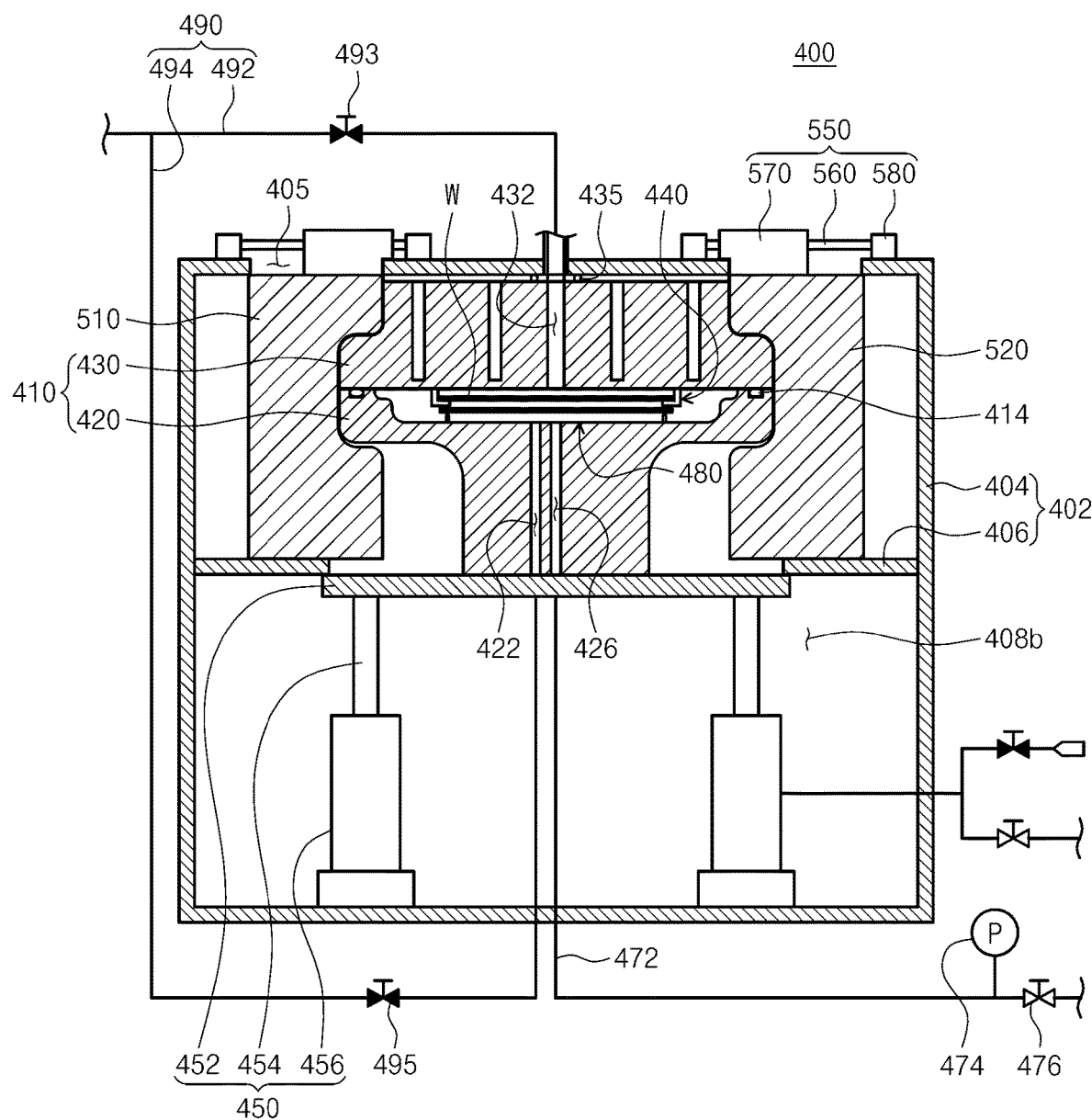

FIGS. 8 to 12 are views illustrating a chamber closing operation. Referring to FIGS. 8 and 12, the chamber closing operation includes an attachment operation, a clamping operation, and a release operation. The attachment operation, the clamping operation, and the release operation are sequentially performed. The substrate W is carried in while the clamping member 500 is located at a release location and the process chamber 410 is located at an opening location. If the substrate W is carried in to be seated in the substrate support unit 440, the cylinder 456 is pressed. Accordingly, the lower body 420 is elevated, and the process chamber 410 is moved to the closing location. If the process chamber 410 is located at the closing location, the clamping member 500 is moved to the locking location to clamp the process chamber 410. Thereafter, the pressing of the cylinder 456 is released.

Figure 13:
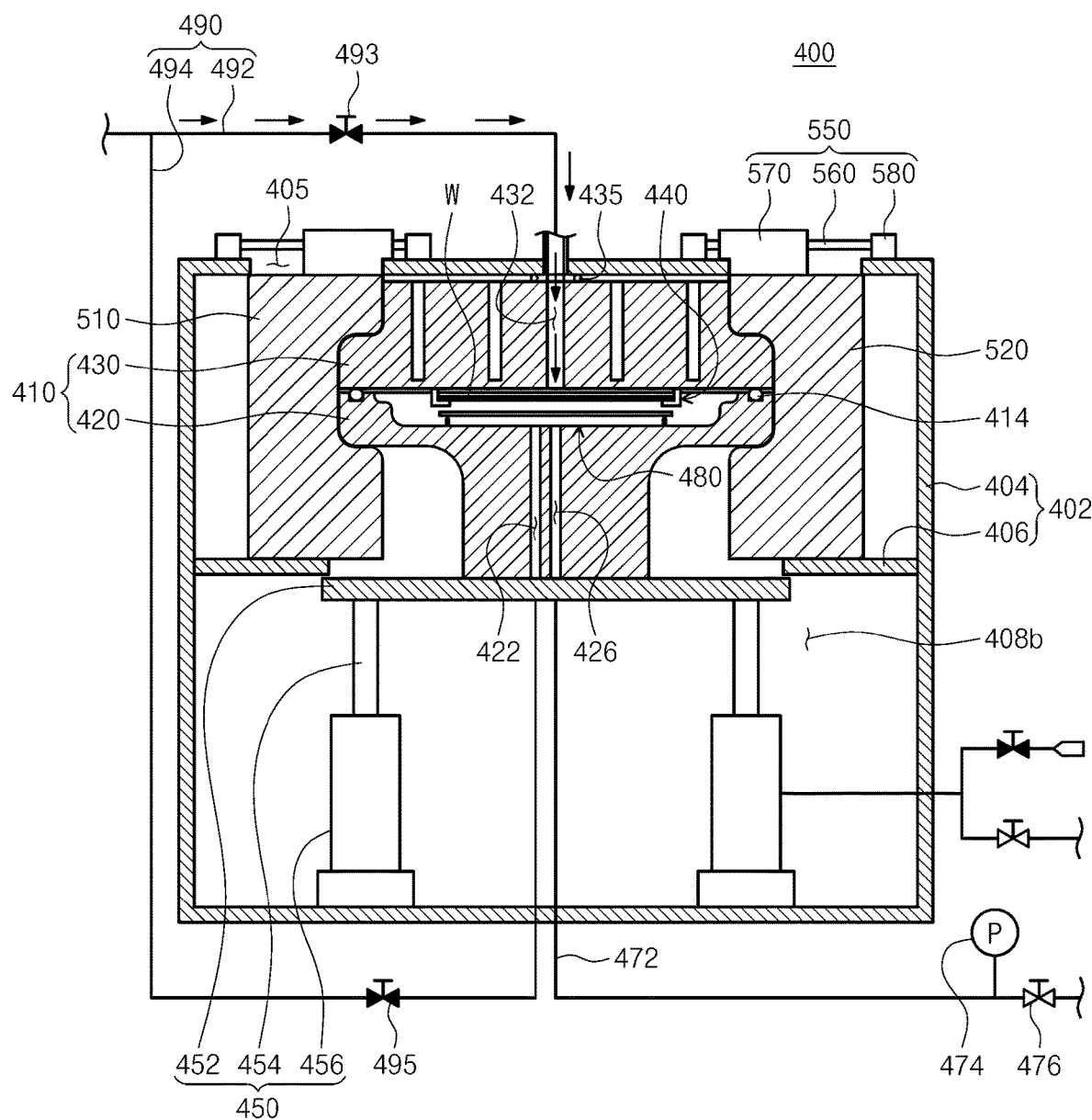
Figure 14:
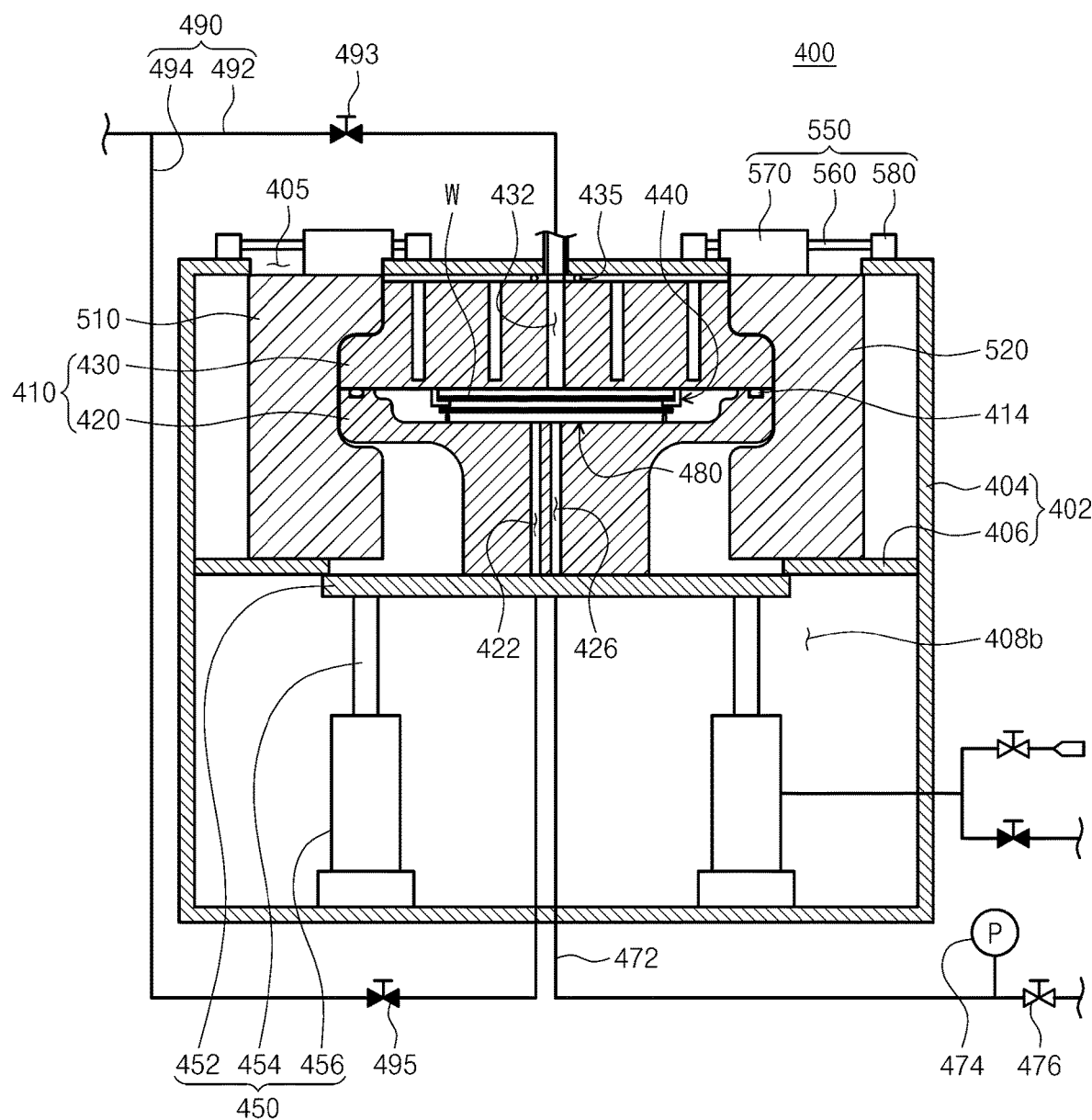
Figure 15:
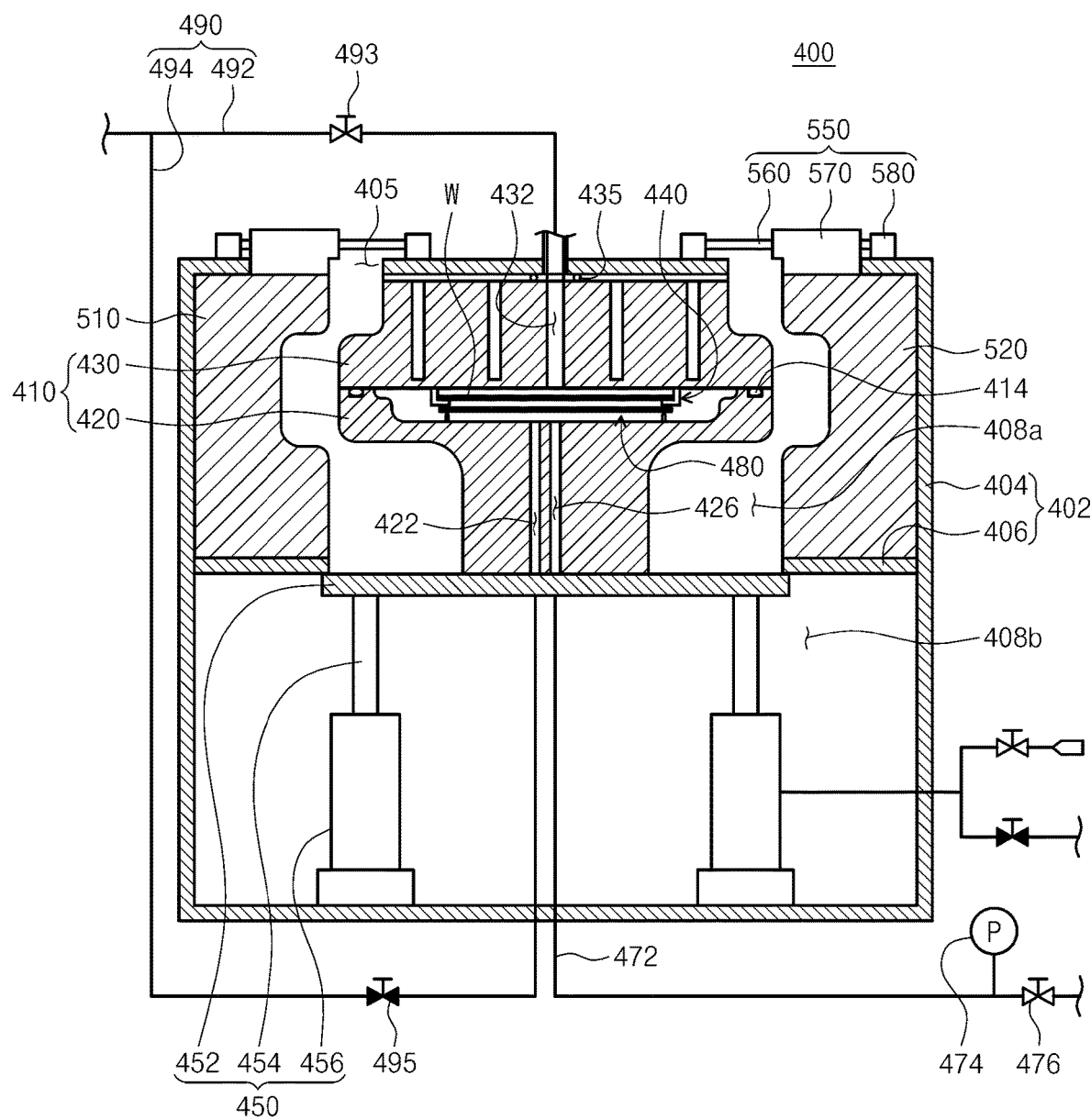
Figure 16:
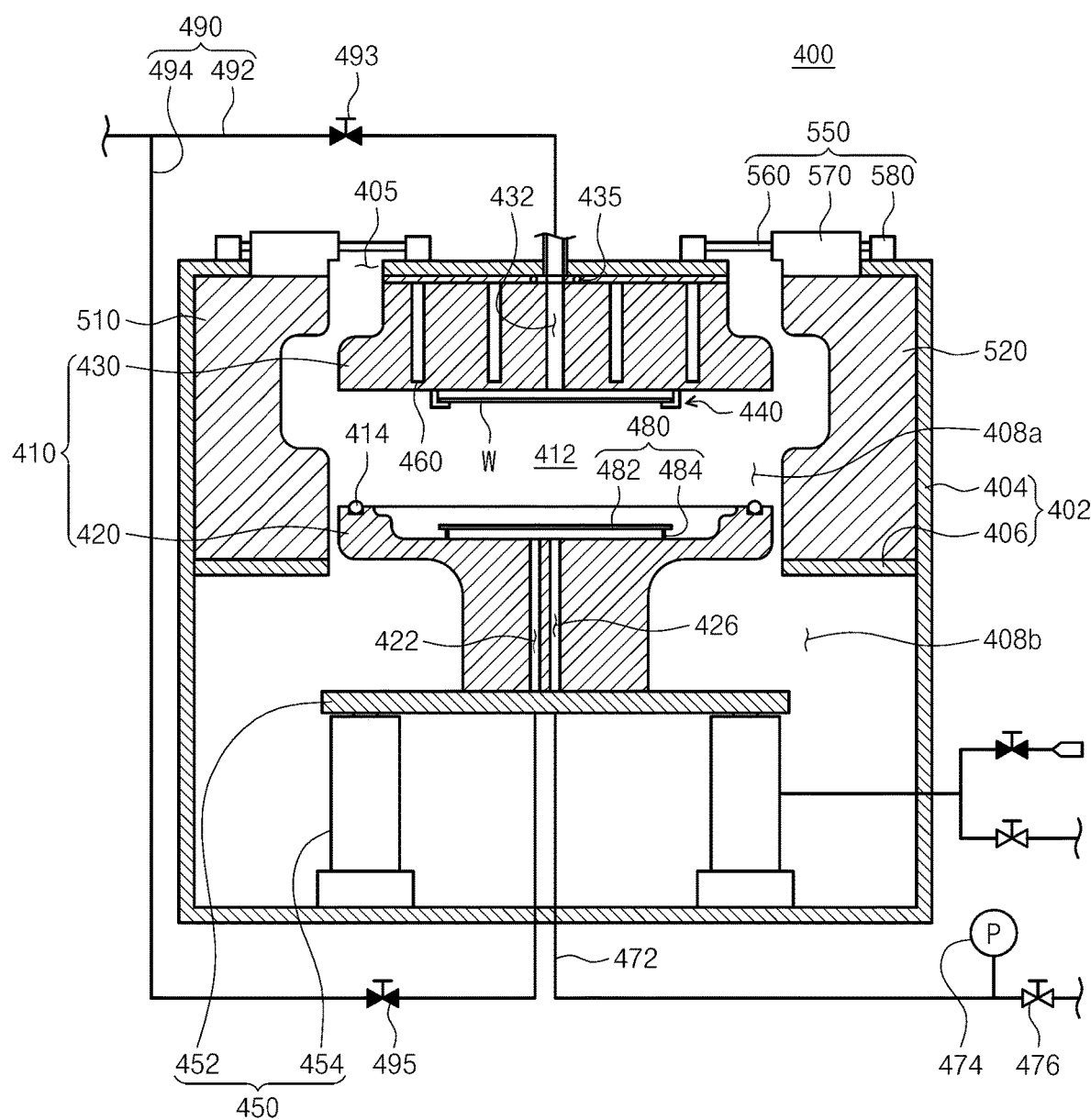
Figure 17:
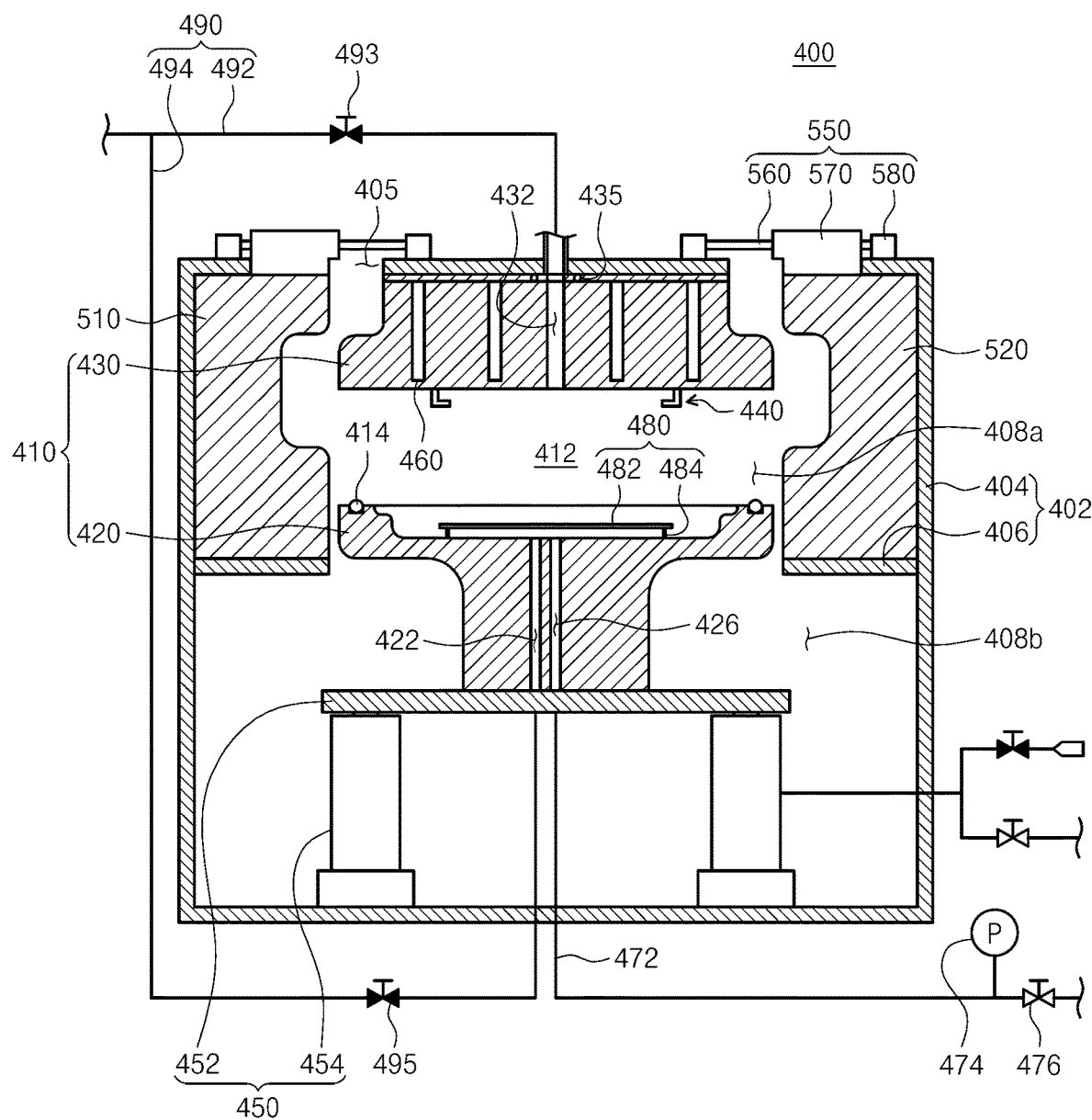

FIG. 13 is a view illustrating a substrate treating operation. Referring to FIG. 13, if the pressing of the cylinder 456 is released, a substrate treating operation of performing a process on the substrate W is progressed. In the substrate treating operation, a treatment fluid is supplied to the treatment space through the lower supply port 422, and the treatment space 412 is maintained at a critical temperature and a critical pressure. If the treatment space 412 reaches the critical temperature and the critical pressure, the supply of the lower support port 422 is stopped and the treatment fluid is supplied through the upper supply port 432.

FIGS. 14 to 17 are views illustrating a chamber opening operation. Referring to FIGS. 14 to 17, the cylinder 456 is pressed before the clamping member 500 is moved to the release location. Accordingly, the lower body 420 maintains a state in which the lower body 420 is supported by the cylinder 456 and the elevation shaft 454. Thereafter, the clamping member 500 is moved from the locking location to the release location. If the clamping member 500 is moved to the release location, the pressing of the cylinder 456 is released and the lower body 420 is lowered. If the treatment space 412 is opened, the substrate W is carried out of the process chamber 410.

According to the embodiment, the process chamber 410 is located at the closing location in the release operation, and the pressing of the cylinder 456 is released in a state in which the clamping member 500 is located at the locking location. Accordingly, the stresses applied to the cylinder 456 may be removed.

Further, if the substrate treating operation is progressed, the pressure in the treatment space 412 is gradually raised by the treatment fluid. The upper body 430 and the lower body 420 are moved such that an aperture is generated while the upper body 430 and the lower body 420 are clamped, due to the raised pressure. As the pressure in the treatment space 412 is gradually raised, the upper body 430 and the lower body 420 are gradually moved. Accordingly, the upper body 430 and the lower body 420 may be prevented from abruptly colliding with the clamping member 500.

Further, even if an aperture is generated between the upper body 430 and the lower body 420, the treatment space 412 may maintain a closed state due to the sealing member 414 and particles may be restrained from being generated between the upper body 430 and the lower body 420. That is, in the attachment operation, the clamping operation, and the release operation, the sealing member is provided in a completely pressed state by the attached bodies 420 and 430. If the substrate treating operation is progressed, an aperture is generated between the upper body 430 and the lower body 420 so that the sealing member 414 is provided in a partially pressed state.

Selectively, as the pressing of the cylinder 414 is released in the release operation, the lower body 420 and the elevation shaft 454 may be gradually lowered and the sealing member 414 may be provided in a partially pressed state.

Figure 19:
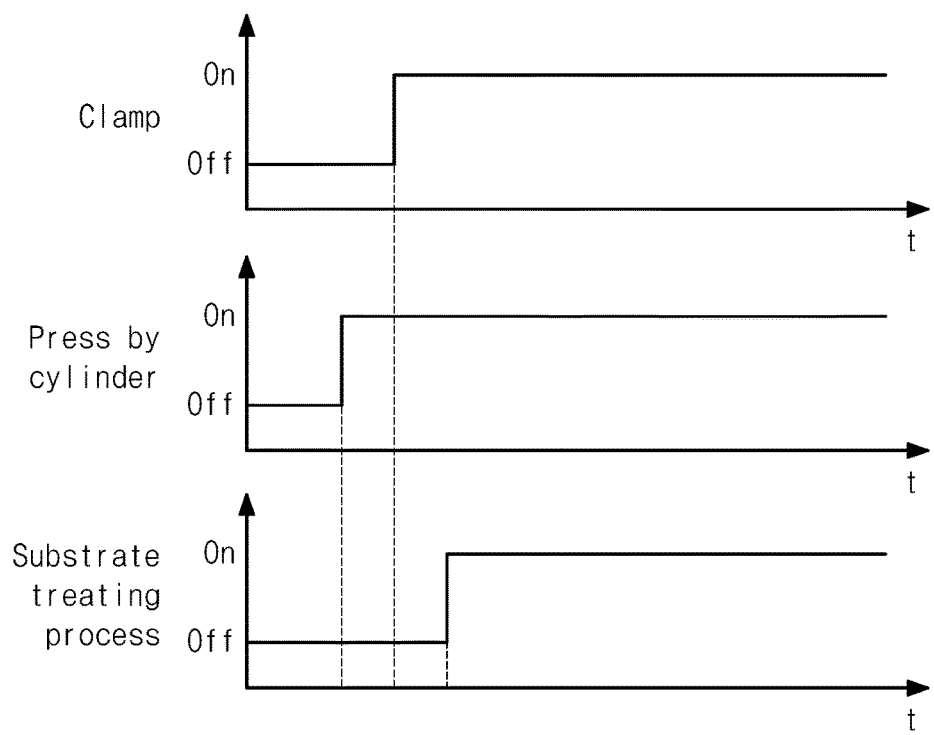
FIG. 19 is a graph depicting another embodiment of FIG. 18.

Unlike the above-mentioned embodiment, it has been described that the attachment operation, the clamping operation, and the release operation are included in the chamber closing operation. However, as illustrated in FIG. 19, the chamber closing operation may include only the attachment operation and the clamping operation, except for the release operation. If the clamping operation is completed, a process for the substrate W may be performed. While the process for the substrate W is progressed, the pressing of the cylinder 456 may be maintained. That is, the upper body 430 and the lower body 420 may perform a process for the substrate W while being attached to each other to be clamped.

Figure 20:
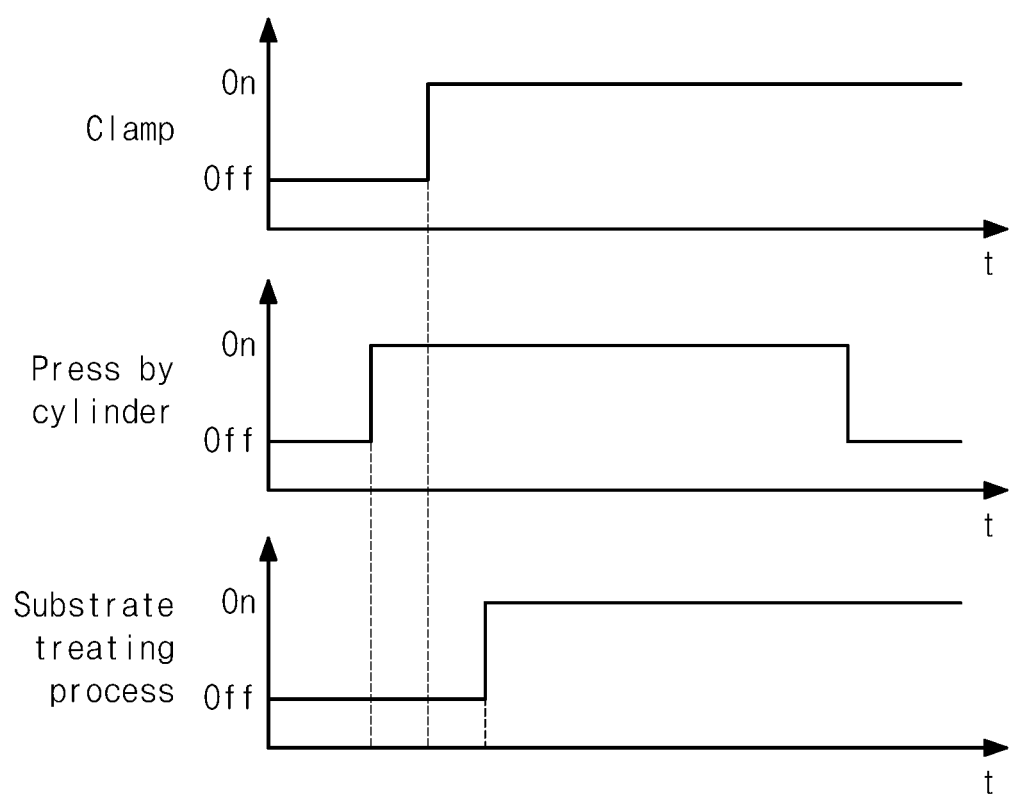
FIG. 20 is a graph depicting another embodiment of FIG. 18.

Further, as illustrated in FIG. 20, the chamber closing operation may include only the attachment operation and the clamping operation. After the clamping operation, a substrate treating operation may be performed. In the substrate treating operation, a treatment fluid may be supplied to the treatment space, and the pressing of the cylinder 456 may be maintained until the treatment space 412 reaches a preset pressure. If the treatment space 412 reaches a preset pressure due to the treatment fluid, the pressing of the cylinder 456 may be released. For example, the preset pressure may be a critical pressure.

Figure 21:
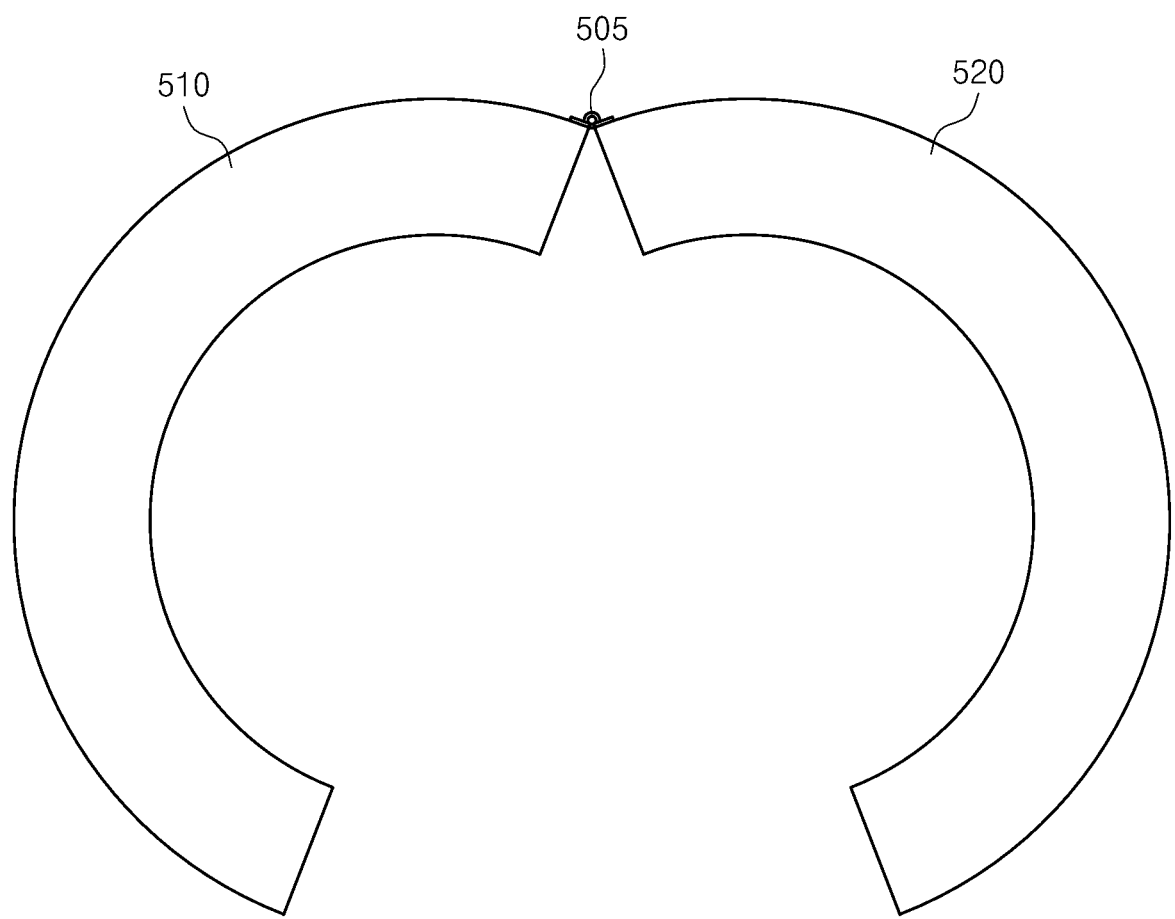
FIG. 21 is a perspective view illustrating another embodiment of a clamping member of FIG. 7.

According to the embodiment, it has been described that the first clamp 510 and the second clamp 520 are linearly moved in one direction. However, as illustrated in FIG. 21, the first clamp 510 and the second clamp 520 may be hinge-coupled to the driving shaft 505, a lengthwise direction of which is parallel to a direction in which the first clamp 510 and the second clamp 520 is elevated. The first clamp 510 and the second clamp 520 may be rotated about the driving shaft 505 by the drivers (not illustrated) and may be moved to a locking location or a release location.

Figure 22:
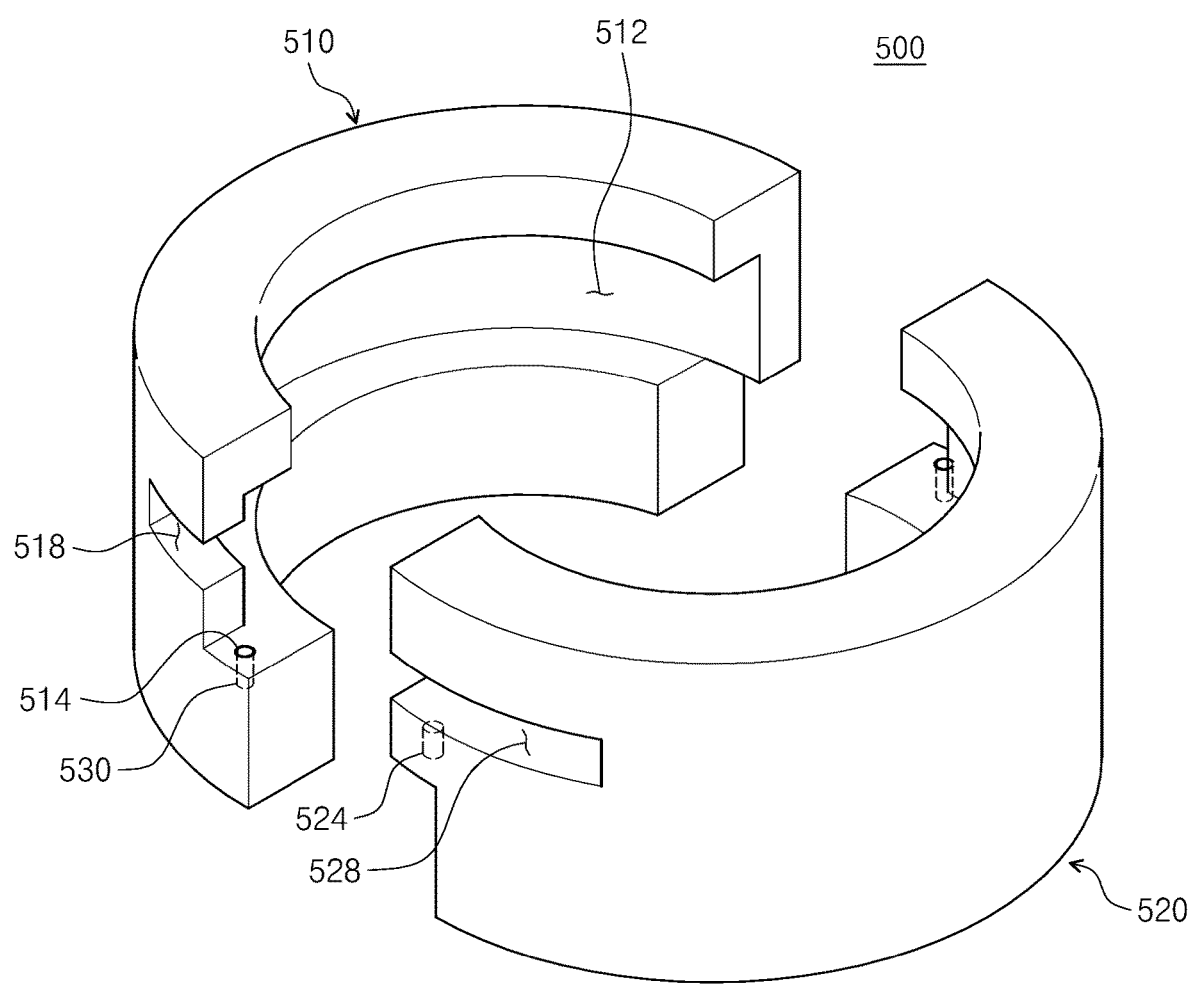
FIG. 22 is a perspective view illustrating another embodiment of a clamping member of FIG. 7.

Further, as illustrated in FIG. 22, a first hole 518 may be formed at one end of the first clamp 510. The first hole 518 may pass through an inner surface and an outer surface of the first clamp 510. The first hole 518 may be a slit extending from a central area of the first clamp 510 in a lengthwise direction of the first clamp 510. A second hole 528 may be formed at one end of the second clamp 520. The second hole 528 may pass through an inner surface and an outer surface of the second clamp 520. The second hole 528 may be a slit extending from a central area of the second clamp 520 in a lengthwise direction of the second clamp 520. The clamping member 500 may be provided such that the first hole 518 and the second hole 528 extend at the locking location. According to an embodiment, the length of a line of the clamping member 500 that connects one end including the first hole 518 and one end including the second hole 528 at the release location may be longer than the diameter of the substrate W. The first hole 518 and the second hole 528 of the clamping member 500 may function as a passage through which the substrate W is carried in and out at the release location. Accordingly, the space efficiency of the clamping member 500 may be improved.

Figure 23:
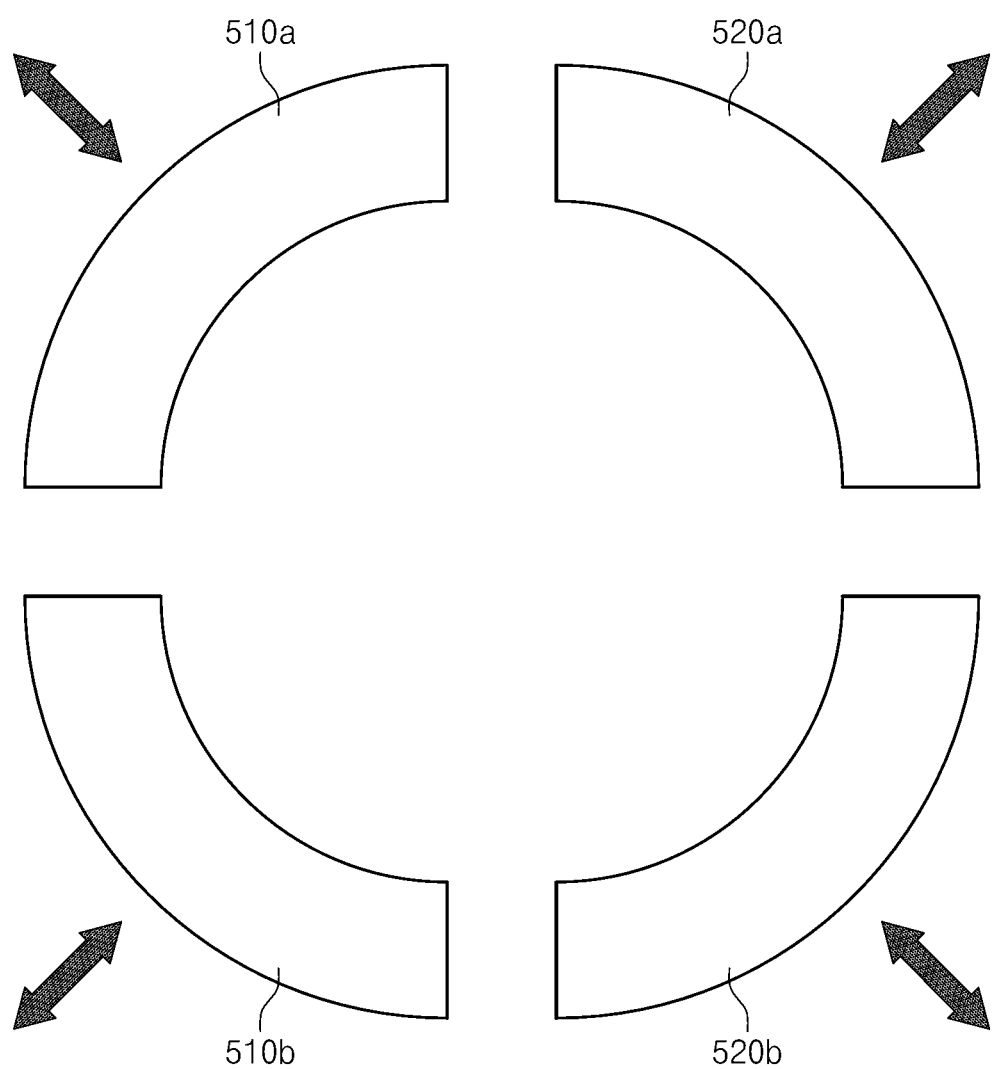
FIG. 23 is a perspective view illustrating another embodiment of a clamping member of FIG. 7.

Further, as illustrated in FIG. 23, the clamping member 500 may include three or more clamps. The clamping member may include a first clamp 510*a*, a second clamp 510*b*, a third clamp 520*a*, and a fourth clamp 520*b*. The clamps 510*a*, 510*b*, 520*a*, and 520*b* may be moved to a location at which the bodies 420 and 430 are clamped or are separated from each other.

Figure 24:
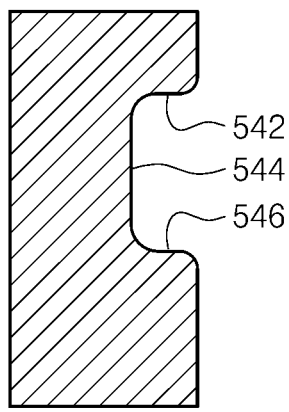
FIG. 24 is a perspective view illustrating another embodiment of a clamping member of FIG. 7.
Figure 24:
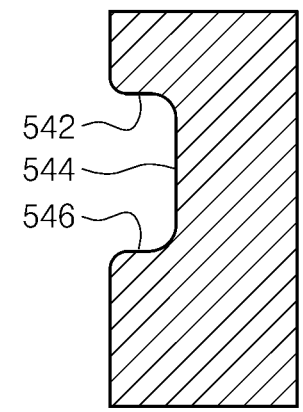

Further, as illustrated in FIG. 24, the first clamp 510 and the second clamp 520 may include an upper surface 542, a lower surface 544, and a side surface 546 that define a clamp groove. The upper surface 542 may be inclined downwards as it goes toward the upper body 430. The lower surface 544 may be inclined upwards as it goes toward the lower body 420. The side surface 546 may connect the upper surface 542 and the lower surface 544. A peripheral portion of the upper surface of the upper body 430 may have a shape corresponding to the upper surfaces 542 of the first clamp 510 and the second clamp 520, and a peripheral portion of the bottom surface of the lower body 420 may have a shape corresponding to the lower surfaces 544 of the first clamp 510 and the second clamp 520. That is, the peripheral portion of the upper surface of the upper body 430 may be inclined upwards as it goes away from a central axis thereof. A peripheral portion of the bottom surface of the lower body 420 may be inclined downwards as it goes away from the central axis thereof.

According to an embodiment of the inventive concept, the upper body and the lower body are clamped by the clamping member during a process. Accordingly, the atmosphere in the treatment space may be stably closed from the outside.

Further, according to an embodiment, the clamping member clamps the upper body and the lower body in a direction that is perpendicular to the movement directions of the bodies. Accordingly, the bodies may be clamped with a small force.

Further, according to the inventive concept, a driving force of the driver is released while a high-pressure process is performed in the process chamber. Accordingly, the stresses applied to the driver may be removed, and damage to the driver and its peripheral devices may be prevented.

The above description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A substrate treating apparatus comprising:
   a process chamber having an upper body and a lower body that are combined with each other to provide a treatment space therein;
   an elevation member configured to elevate any one of the upper body and the lower body to an opening location at which the one of the upper body and the lower body is spaced apart from the other of the upper body and the lower body or a closing location at which the one of the upper body and the lower body is attached to the other of the upper body and the lower body;
   a clamping member configured to clamp the upper body and the lower body located at the closing location;
   a movable member configured to move the clamping member to a locking location at which the clamping member clamps the upper body and the lower body or to a release location at which the clamping member is spaced apart from the upper body and the lower body; and
   a housing surrounding the process chamber, the clamping member, and the elevation member,
   wherein the housing includes:
      a tub-shaped body; and
      an intermediate plate partitioning an interior of the tub-shaped body into an upper space and a lower space and having a hollow, and
   wherein the process chamber and the clamping member are located in any one of the upper space and the lower space, and the elevation member is located in the other of the upper space and the lower space.

2. The substrate treating apparatus of claim 1, further comprising:
   a substrate support unit configured to support the substrate in the treatment space; and
   a fluid supply unit configured to supply a treatment fluid to the treatment space.

3. The substrate treating apparatus of claim 2, wherein the clamping member includes:
   a first clamp located on one side of the process chamber; and
   a second clamp located to face the first clamp while the process chamber being interposed between the first clamp and the second clamp.

4. The substrate treating apparatus of claim 3, wherein the upper body is shaped such that a central portion of an upper surface thereof is higher than an peripheral portion of the upper surface thereof,
- wherein the lower body is shaped such that a central portion of a bottom surface thereof is lower than a peripheral portion of the bottom surface thereof, and
- wherein each of the first clamp and the second clamp has a clamp groove, into which the peripheral portion of the upper surface of the upper body and the peripheral portion of the bottom surface of the lower body are inserted, on an inner surface thereof.

5. The substrate treating apparatus of claim 4, wherein each of the first clamp and the second clamp includes:
- an upper surface that is inclined downwards as it goes toward the upper body;
- a lower surface that is inclined upwards as it goes towards the lower body; and
- a side surface connecting the upper surface and the lower surface,
- wherein the clamp groove is formed through combination of the upper surface, the lower surface, and the side surface,
- wherein the peripheral portion of the upper surface of the upper body has a shape corresponding to the upper surfaces of the first clamp and the second clamp, and
- wherein the peripheral portion of the bottom surface of the lower body has a shape corresponding to the lower surfaces of the first clamp and the second clamp.

6. The substrate treating apparatus of claim 4, wherein the movable member includes:
- a driving shaft, a lengthwise direction of which is perpendicular to an elevation direction and to which the first clamp and the second clamp are hinge-coupled; and
- a driving member configured to drive the driving shaft such that the clamping member is moved to the locking location or the release location along the lengthwise direction of the driving shaft.

7. The substrate treating apparatus of claim 4, wherein a first hole of a slit shape that passes through an inner surface and an outer surface of the first clamp is formed at one end of the first clamp,
- wherein a second hole of a slit shape that passes through an inner surface and an outer surface of the second clamp is formed at one end of the second clamp,
- wherein the first hole and the second hole of the clamping member are communicated with each other at the locking location, and
- wherein the first hole and the second hole function as passages, through which the substrate is carried in and out.

8. The substrate treating apparatus of claim 3, wherein the first clamp is provided such that one side surface thereof contacting the second clamp is stepped,
- wherein the second clamp is provided such that an opposite side surface thereof contacting the first clamp is stepped to correspond to the one side surface thereof,
- wherein a first pin groove, into which a locking pin is inserted, is formed in one of a stepped area of the first clamp and a stepped area of the second clamp, and a second pin groove is formed on the other thereof,
- wherein the first pin groove and the second groove face each other at the locking location, and
- wherein the first pin groove and the second pin groove is located to be opposite to each other in a direction that is perpendicular to movement directions of the first clamp and the second clamp.

9. The substrate treating apparatus of claim 2,
- wherein the elevation member further includes:
- a driver configured to elevate the upper body or the lower body,
- wherein the driver drives the movable member to perform an attachment operation of providing a driving force to the driver such that the lower body and the upper body are attached to each other if the substrate is introduced into the treatment space, a clamping operation of, after the attachment operation, clamping the upper body and the lower body attached to each other by the driving force with the clamping member, and a substrate treating operation of, after the clamping operation, supplying a treatment liquid to the treatment space, and
- wherein if the treatment space reaches a preset pressure due to a treatment fluid in the substrate treating operation, the driving force of the driver is released while the clamping is made.

10. The substrate treating apparatus of claim 2, further comprising:
- a heating member configured to heat the treatment space, wherein the heating member further includes:
- a heater located in at least one of the upper body and the lower body and having a bar shape, a lengthwise direction of which faces a direction that is perpendicular to a movement direction of the clamping member.

11. The substrate treating apparatus of claim 1, wherein the elevation member includes:
- a support plate configured to support one of the upper body and the lower body, the support plate being able to elevate, and
- wherein the support plate has a diameter that is larger than a diameter of the hollow.

12. The substrate treating apparatus of claim 1, wherein any one of the upper body and the lower body is moved by the elevation member, and the other of the upper body and the lower body is fixed to the housing,
- wherein the housing includes:
- an impact absorbing member configured to support one of the upper body and the lower body, which is fixed to the housing, and
- wherein the impact absorbing member is formed of an elastic material.

13. The substrate treating apparatus of claim 1, further comprising:
- wherein the elevation member further includes:
- a driver configured to elevate the upper body or the lower body,
- wherein the driver drives the movable member to perform an attachment operation of providing a driving force to the driver such that the lower body and the upper body are attached to each other if the substrate is introduced into the treatment space, a clamping operation of, after the attachment operation, clamping the upper body and the lower body attached to each other by the driving force with the clamping member, and a release operation of, after the clamping operation, releasing the driving force of the driver while the clamping operation has been performed, and
- wherein a process for the substrate is performed after the driving force is released.

14. The substrate treating apparatus of claim 13, wherein the process chamber further includes:

a sealing member located between the upper body and the lower body to seal a space between the upper body and the lower body, wherein the sealing member is provided in a first pressing state in the attachment operation and the clamping operation and is provided in a second pressing state after the driving force is released, and wherein the first pressing state is a pressing state that is greater than the second pressing state.

15. A method for treating a substrate by using the substrate treating apparatus of claim 1, the method comprising:
    an attachment operation of attaching the lower body and the upper body if the substrate is introduced into the treatment space;
    a clamping operation of clamping the upper body and the lower body attached to each other after the attachment operation, with the clamping member; and
    a substrate treating operation of treating the substrate in the treatment space after the clamping operation.

16. The method of claim 15, wherein in the attachment operation and the clamping operation, the upper body and the lower body are attached to each other by a driving force provided to the driver of the elevation member, and
    wherein the driving force is released in the substrate treating operation.

17. The method of claim 16, wherein in the substrate treating operation, the substrate is treated by using a supercritical fluid.

18. The method of claim 17, wherein the substrate treating operation includes:
    a drying process of drying the substrate.

19. The method of claim 15, wherein in the attachment operation, the clamping operation, and the substrate treating operation, the upper body and the lower body are attached to each other by the driving force provided to the driver of the elevation member.

20. The method of claim 15, wherein in the attachment operation and the clamping operation, the upper body and the lower body are attached to each other by a driving force provided to the driver of the elevation member, and
    wherein in the substrate treating operation, the treatment space supplies the treatment fluid, and if the treatment space reaches a preset pressure, the driving force of the driver is released.

21. A substrate treating apparatus comprising:
    a process chamber having an upper body and a lower body that are combined with each other to provide a treatment space therein;
    an elevation member configured to elevate any one of the upper body and the lower body to an opening location at which the one of the upper body and the lower body is spaced apart from the other of the upper body and the lower body or a closing location at which the one of the upper body and the lower body is attached to the other of the upper body and the lower body;
    a clamping member configured to clamp the upper body and the lower body located at the closing location; and
    a movable member configured to move the clamping member to a locking location at which the clamping member clamps the upper body and the lower body or to a release location at which the clamping member is spaced apart from the upper body and the lower body,
    wherein the movable member includes:
        a guide rail having a lengthwise direction that is perpendicular to an elevation direction;
        a bracket coupling the guide rail and the clamping member; and
        a driving member configured to drive the guide rail such that the clamping member is moved to the locking location or the release location along the lengthwise direction of the guide rail.

22. The substrate treating apparatus of claim 21, wherein the guide rail is installed on an upper surface or a bottom surface of a housing outside the housing surrounding the process chamber.

23. A substrate treating apparatus comprising:
    a process chamber having an upper body and a lower body that are combined with each other to provide a treatment space therein;
    an elevation member configured to elevate any one of the upper body and the lower body to an opening location at which the one of the upper body and the lower body is spaced apart from the other of the upper body and the lower body or a closing location at which the one of the upper body and the lower body is attached to the other of the upper body and the lower body;
    a clamping member configured to clamp the upper body and the lower body located at the closing location;
    a movable member configured to move the clamping member to a locking location at which the clamping member clamps the upper body and the lower body or to a release location at which the clamping member is spaced apart from the upper body and the lower body; and
    wherein the elevation member further includes:
        a driver configured to elevate the upper body or the lower body,
    wherein the driver drives the movable member to perform an attachment operation of providing a driving force to the driver such that the lower body and the upper body are attached to each other if the substrate is introduced into the treatment space and a clamping operation of, after the attachment operation, clamping the upper body and the lower body attached to each other by the driving force with the clamping member, and
    wherein the process for the substrate is performed while a driving force is continuously provided to the driver after the clamping operation.

* * * * *